(12) United States Patent
Do et al.

(10) Patent No.: US 9,929,023 B2
(45) Date of Patent: Mar. 27, 2018

(54) METHOD OF MANUFACTURING SEMICONDUCTOR DEVICE

(71) Applicant: SAMSUNG ELECTRONICS CO., LTD., Suwon-si, Gyeonggi-do (KR)

(72) Inventors: Jung-Ho Do, Yongin-si (KR);
Jonghoon Jung, Seongnam-si (KR);
Sanghoon Baek, Seoul (KR);
Seungyoung Lee, Seoul (KR);
Taejoong Song, Seongnam-si (KR);
Jinyoung Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/350,716

(22) Filed: Nov. 14, 2016

(65) Prior Publication Data

US 2017/0148687 A1    May 25, 2017

(30) Foreign Application Priority Data

Nov. 19, 2015  (KR) .......................... 10-2015-0162675
Mar. 23, 2016  (KR) .......................... 10-2016-0034831

(51) Int. Cl.
*H01L 21/8238*    (2006.01)
*H01L 21/3213*    (2006.01)

(52) U.S. Cl.
CPC ............ *H01L 21/32139* (2013.01); *H01L 21/823821* (2013.01); *H01L 21/823878* (2013.01); *H01L 21/823807* (2013.01)

(58) Field of Classification Search
CPC .............. H01L 21/308; H01L 21/3086; H01L 21/32139; H01L 21/76224; H01L 21/76229; H01L 21/823885
USPC .......................................... 438/212, 424–427
See application file for complete search history.

(56) References Cited

U.S. PATENT DOCUMENTS

| | | | |
|---|---|---|---|
| 6,044,007 A | 3/2000 | Capodieci | |
| 7,382,912 B2 | 6/2008 | Zhang | |
| 7,707,539 B2 | 4/2010 | Huang et al. | |
| 8,527,916 B1 | 9/2013 | Chiang et al. | |
| 9,104,833 B2 | 8/2015 | Kuo et al. | |
| 2007/0148881 A1* | 6/2007 | Tseng ............... | H01L 21/76224 438/296 |
| 2009/0325360 A1* | 12/2009 | Lim ..................... | H01L 21/308 438/424 |
| 2013/0273711 A1* | 10/2013 | Liu ..................... | H01L 21/3086 438/424 |
| 2014/0110241 A1 | 4/2014 | Deev | |
| 2014/0317581 A1 | 10/2014 | Chuang et al. | |

(Continued)

*Primary Examiner* — Brook Kebede
(74) *Attorney, Agent, or Firm* — Volentine & Whitt, PLLC

(57) ABSTRACT

A method of manufacturing a semiconductor device may include forming first trenches that define active patterns extending in a first direction on a substrate, forming first insulating layers filling the first trenches, forming first mask patterns extending in the first direction while having a first width along a second direction perpendicular to the first direction, forming a second mask pattern extending in the first direction while having a second width along the second direction, and forming a second trench that partly defines an active region by executing a first etching process that etches the active patterns and the first insulating layer using the first mask patterns and the second mask pattern.

20 Claims, 38 Drawing Sheets

(56) References Cited

U.S. PATENT DOCUMENTS

2015/0050810 A1 2/2015 Lee et al.
2015/0325572 A1* 11/2015 Cheng ................... H01L 21/762
　　　　　　　　　　　　　　　　　　　257/369

* cited by examiner

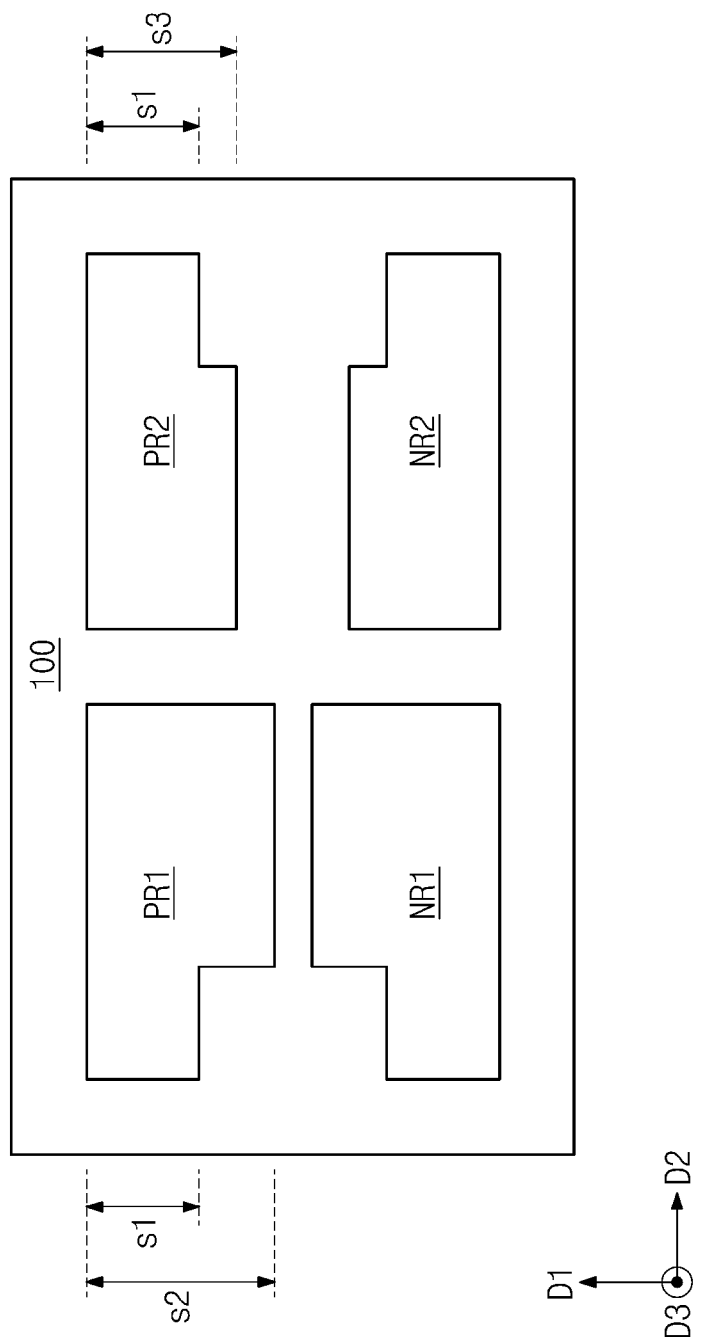

METHOD OF MANUFACTURING SEMICONDUCTOR DEVICE

PRIORITY STATEMENT

This U.S. non-provisional patent application claims priority under 35 U.S.C. § 119 of Korean Patent Application No. 10-2016-0034831, filed on Mar. 23, 2016, and Korean Patent Application No. 10-2015-0162675, filed on Nov. 19, 2015, the entire contents of which are hereby incorporated by reference.

BACKGROUND

The inventive concept relates to methods of manufacturing semiconductor devices, and more particularly, to a method of manufacturing a semiconductor device having an active region of a varying width.

As semiconductor devices become more highly integrated and a circuit configurations of the devices become more complex, the shape (footprint) of an active region such as a PMOS region and/or an NMOS region in which transistors are disposed is diversifying. As a result, there have been made many attempts to form a polygonal active region that breaks away from an existing tetragonal active region. However, a corner of the active region, unlike what was intended at the time of a layout design, is not accurately formed and a corner rounding phenomenon where a corner becomes rounded may occur.

This corner rounding phenomenon causes a serious error in an actual semiconductor device. That is, a standard cell disposed near an active region of a rounded corner may not operate and an electrical short may occur between the standard cell and other standard cells or between the standard cell and a conductive line. Thus, it is very important to prevent a corner rounding phenomenon from occurring in an active region especially one whose width varies along the direction of its length.

SUMMARY

The inventive concept provide examples of a manufacturing method of a semiconductor device which include forming first trenches that define active patterns extending in a first direction on a substrate, forming a first insulating layer filling the first trenches, forming first mask patterns extending in the first direction and each of which has a first width along a second direction perpendicular to the first direction, forming a second mask pattern extending in the first direction while having a second width along the second direction, forming a second trench that forms a partly defined active region by executing a first etching process that etches the active patterns and the first insulating layer using the first mask patterns and the second mask pattern, and forming a second insulating layer filling the second trench.

The inventive concept also provides examples of a manufacturing method of a semiconductor device which include forming first trenches that define active patterns extending in a first direction on a substrate, forming a first insulating layer filling the first trenches, forming a first mask pattern extending in the first direction and which has a first width along a second direction perpendicular to the first direction, forming a second mask pattern extending in the first direction and which has a second width along the second direction, forming a second trench that forms a partly defined active region by executing a first etching process that etches the active patterns and the first insulating layer using the first mask pattern and the second mask pattern, and forming a second insulating layer filling the second trench.

The inventive concept also provides examples of a manufacturing method of a semiconductor device which include forming, in a semiconductor substrate, first trenches that delimit parallel linear active patterns spaced apart from one another in a first direction and each extending longitudinally in a second direction perpendicular to the first direction, forming a first insulating layer filling the first trenches, executing a first patterning process to form at least one first mask pattern and executing a second patterning process, discrete from the first patterning process to form a second mask pattern before or after the at least one first mask pattern is formed, executing a first etching process, using the first and second mask patterns as an etch mask, to remove sections of the active patterns and the first insulating layer and thereby form a second trench, and forming a second insulating layer filling the second trench. Each first mask pattern lies over at least part of a respective one of the active patterns and has a side extending in the second direction parallel to the active patterns, and the second mask pattern has a side extending in the first direction and which meets the side of each said at least one first mask pattern as viewed in plan. Thus, a side of the second mask pattern subtends a right angle with a side of each first mask pattern as viewed in plan;

BRIEF DESCRIPTION OF THE FIGURES

The above and/or other aspects will be more apparent by referring to the detailed description, which follows, of examples of the inventive concept as made with reference to the accompanying drawings.

FIGS. 2A-11D illustrate examples of a method of manufacturing a semiconductor device, having a layout of FIG. 1, in accordance with the inventive concept, and in which:

FIGS. 2A, 3A, 4A, 5A, 6A, 7A, 8A, 9A, 10A and 11A are plan views of a semiconductor device during the course of its manufacture;

FIGS. 2D, 3D, 4D, 5D, 6D, 7D, 8D, 9D, 10D and 11D are cross-sectional views taken along respective lines C-C' of the FIGS. 2A, 3A, 4A, 5A, 6A, 7A, 8A, 9A, 10A and 11A.

FIG. 12 a plan view of a layout of other examples of a semiconductor device.

DETAILED DESCRIPTION

Below, examples of the inventive concept will now be described more fully so that those skilled in the art can easily comprehend the inventive concept.

Figure 1:
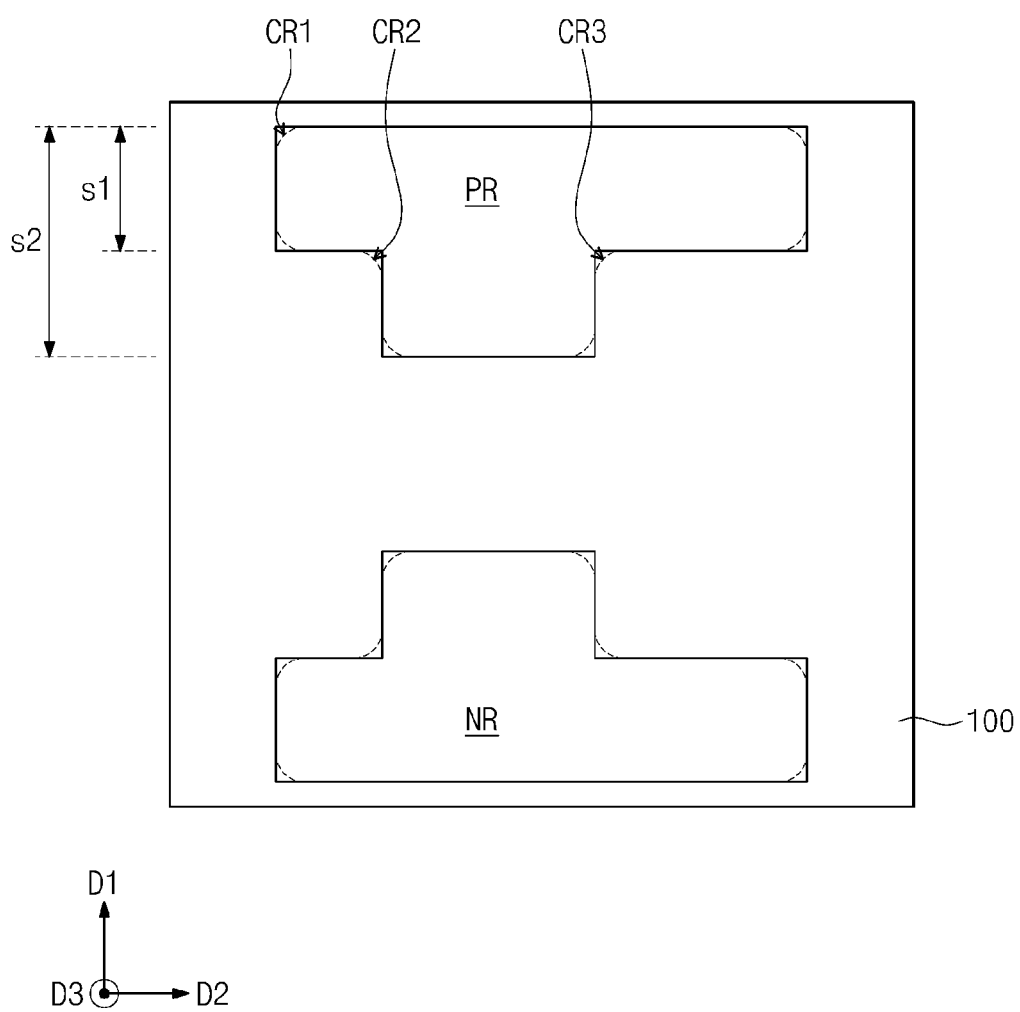
FIG. 1 is a conceptual diagram of a layout of an example of a semiconductor device for use in explaining an aspect of the inventive concept.
Figure 2A:
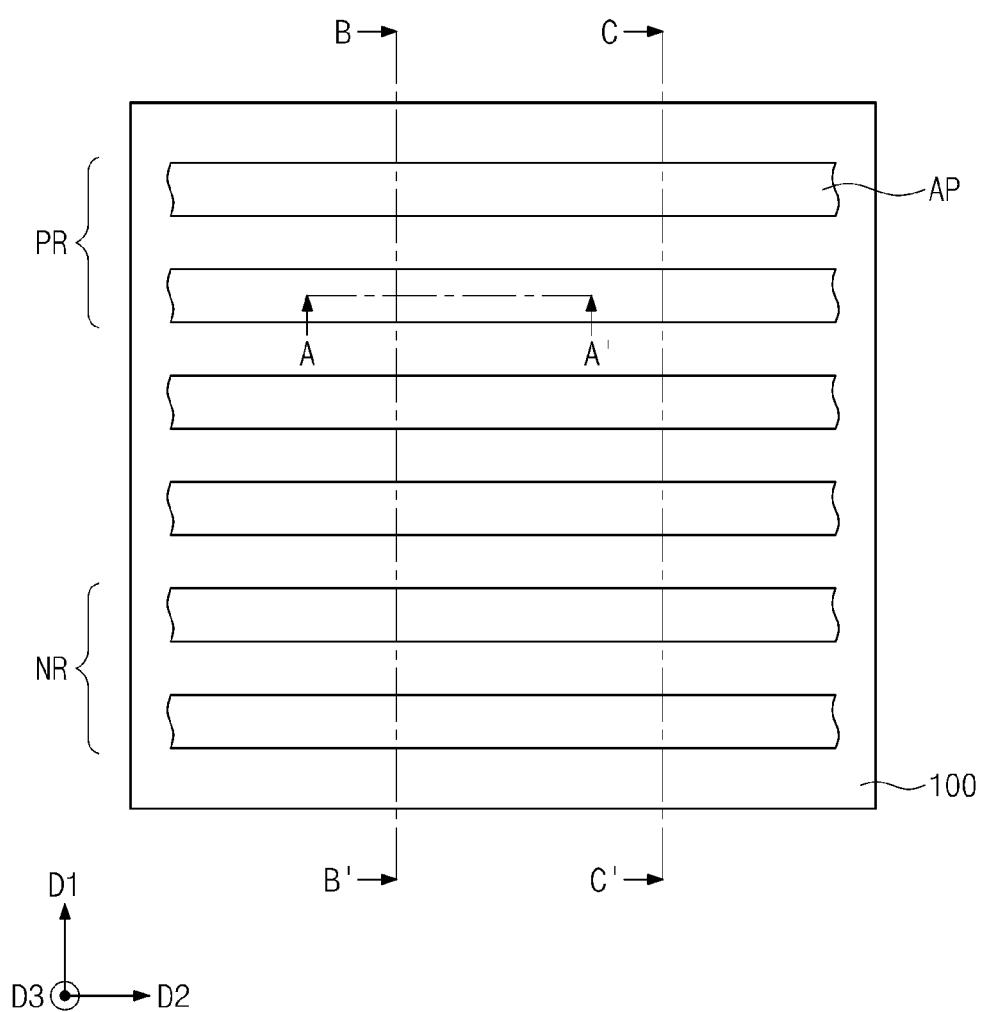
Figure 2B:
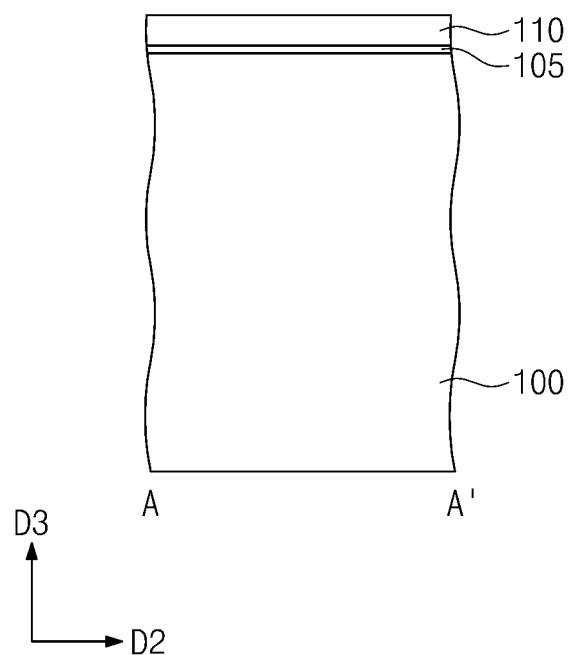
FIGS. 2B, 3B, 4B, 5B, 6B, 7B, 8B, 9B, 10B and 11B be cross-sectional views taken along respective lines A-A' of the FIGS. 2A, 3A, 4A, 5A, 6A, 7A, 8A, 9A, 10A and 11A.
Figure 2C:
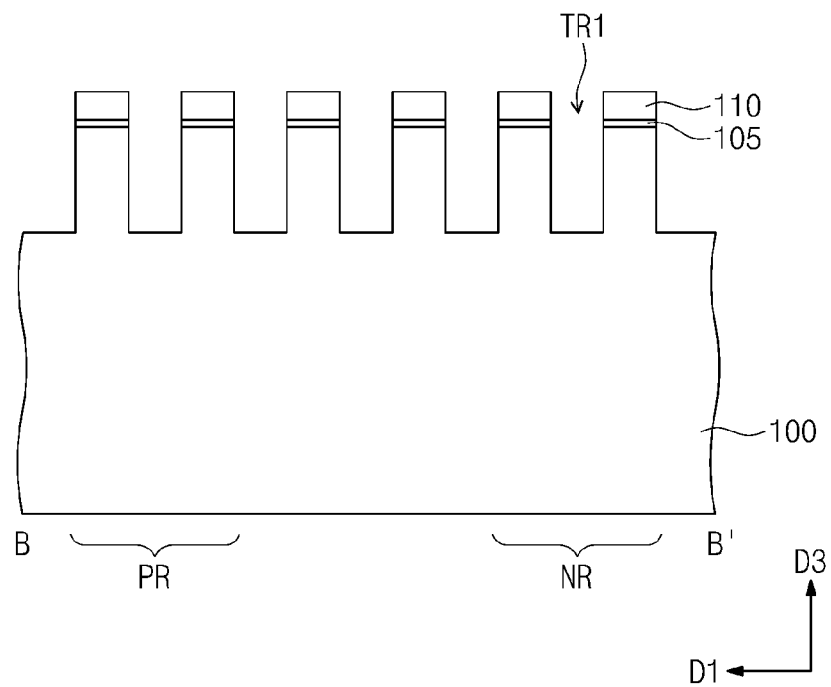
FIGS. 2C, 3C, 4C, 5C, 6C, 7C, 8C, 9C, 10C and 11C are cross-sectional views taken along respective lines B-B' of the FIGS. 2A, 3A, 4A, 5A, 6A, 7A, 8A, 9A, 10A and 11A.
Figure 2D:
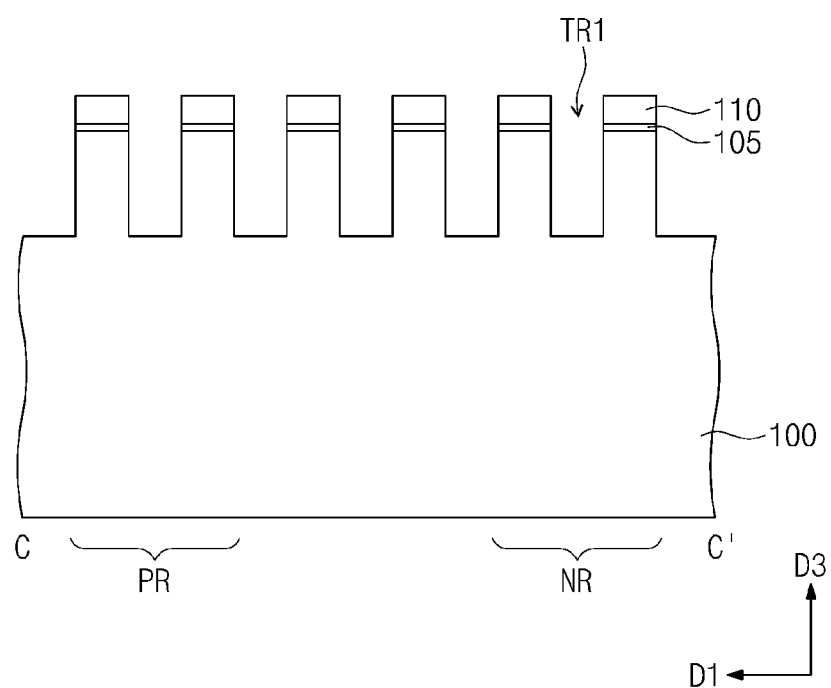
Figure 3A:
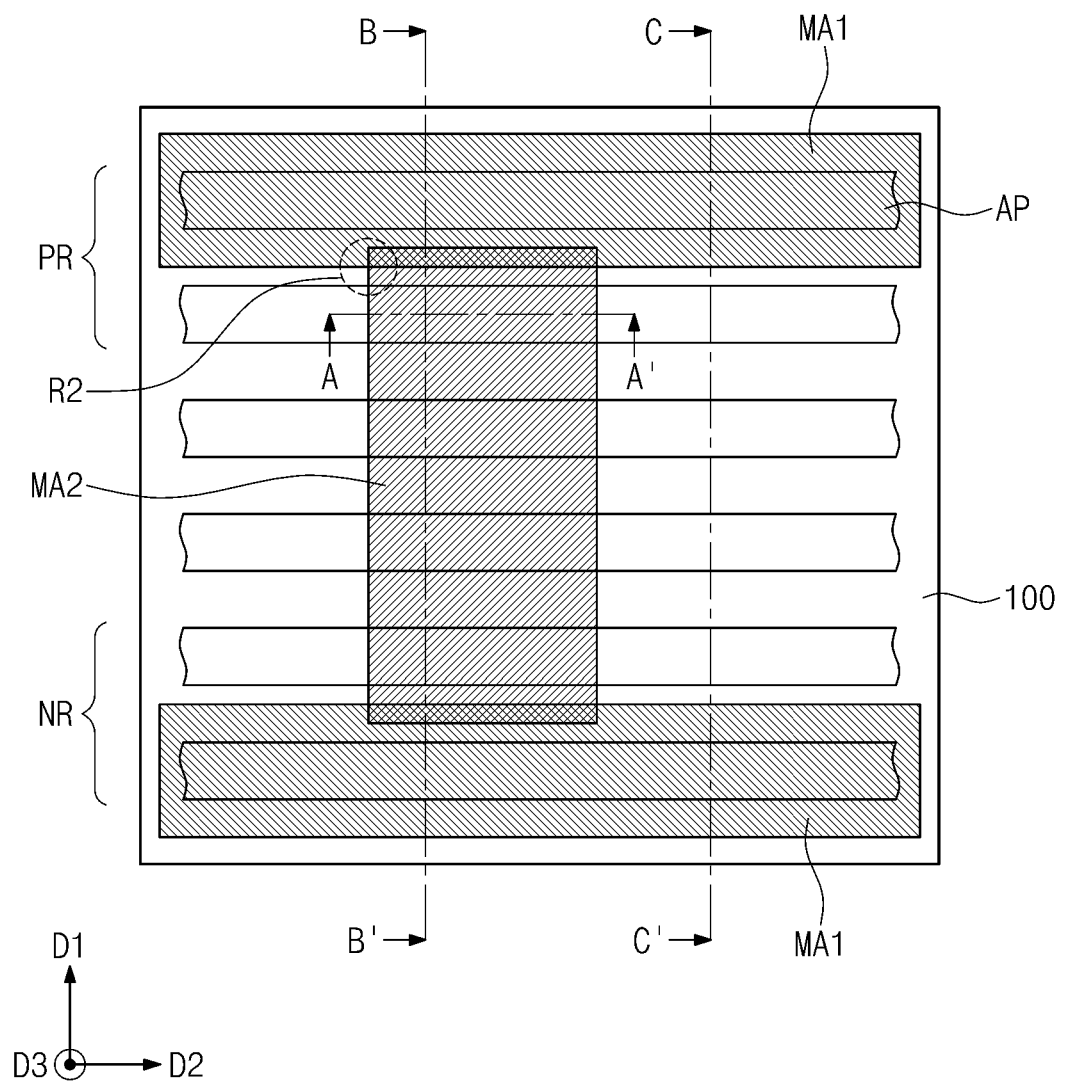
Figure 3B:
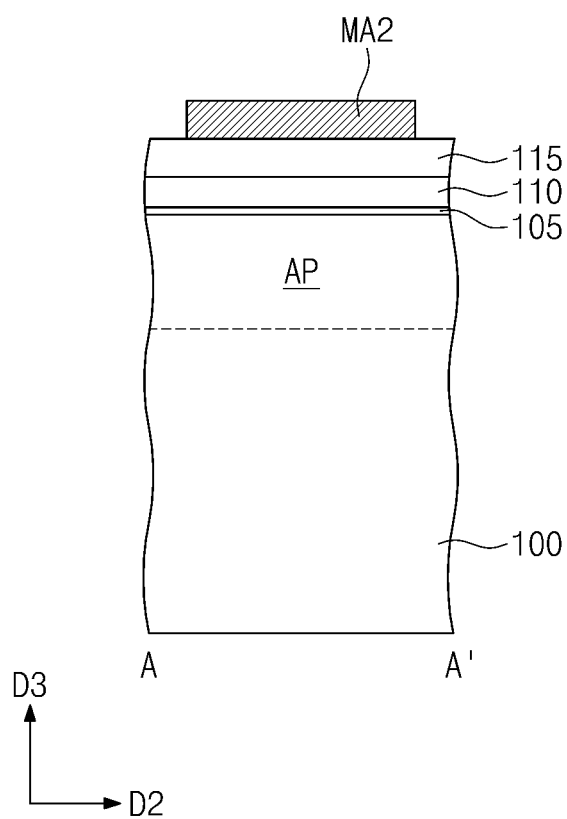
Figure 3C:
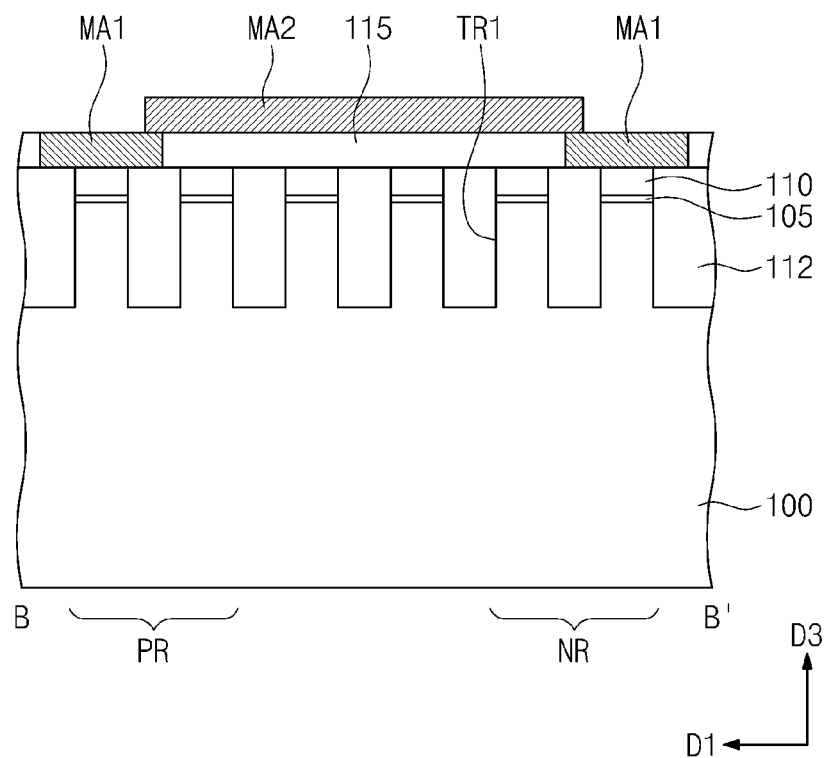
Figure 3D:
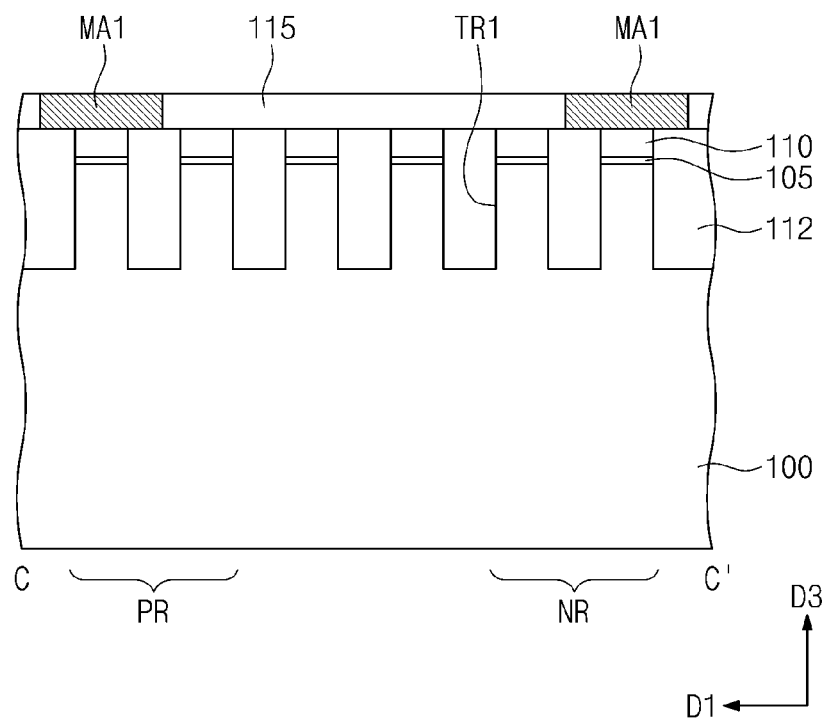
Figure 4A:
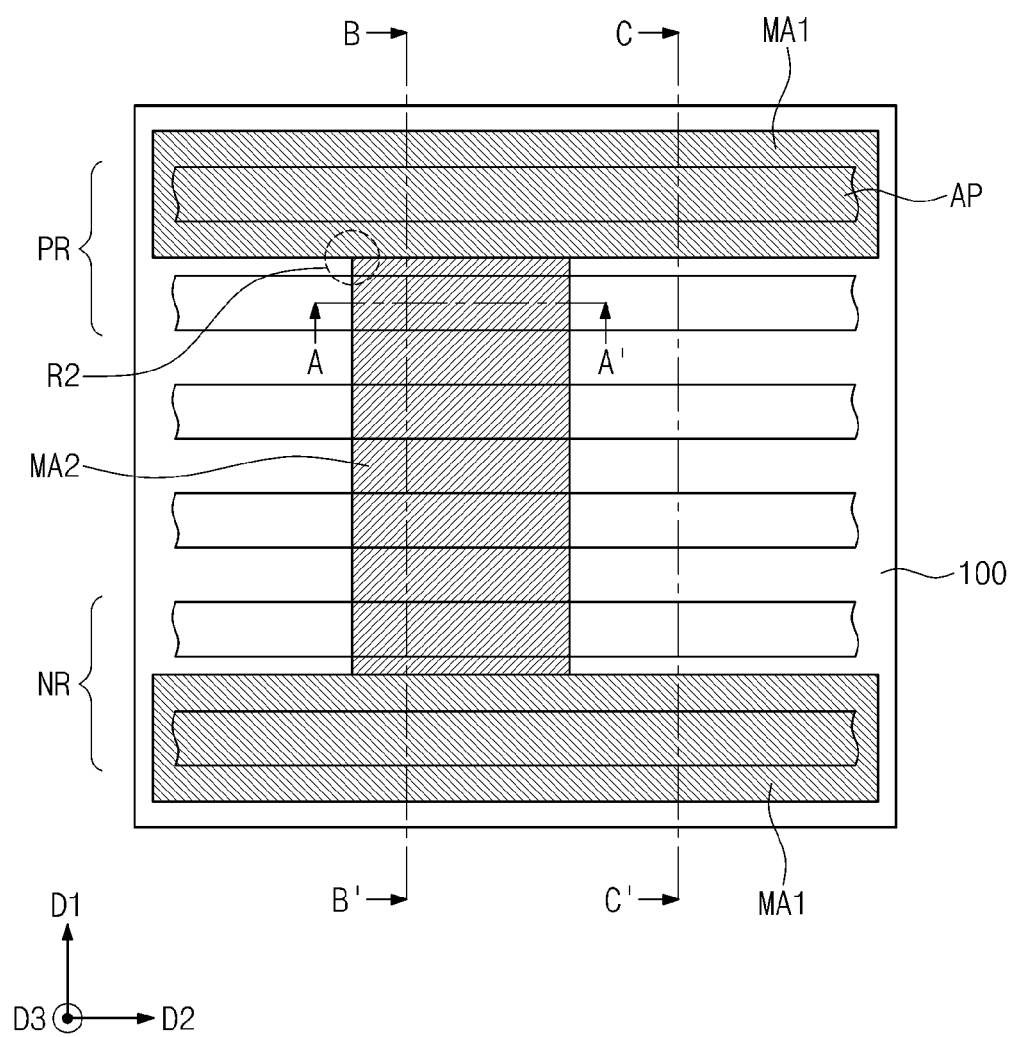
Figure 4B:
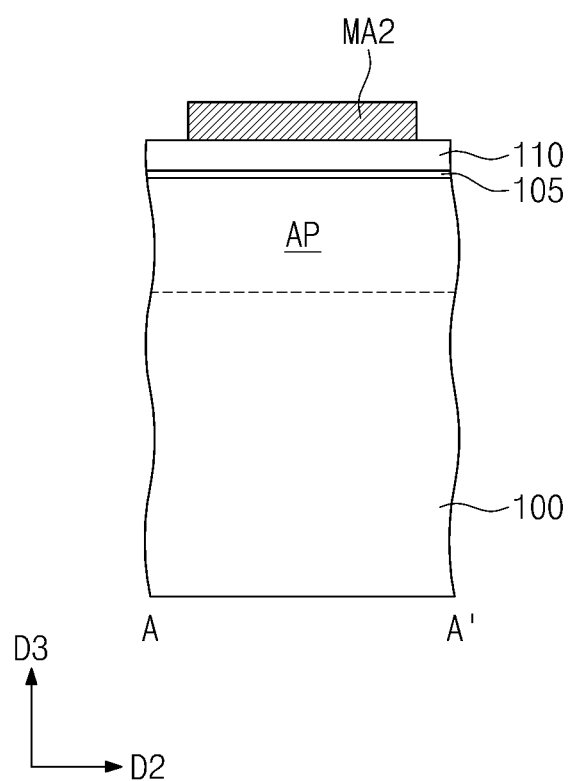
Figure 4C:
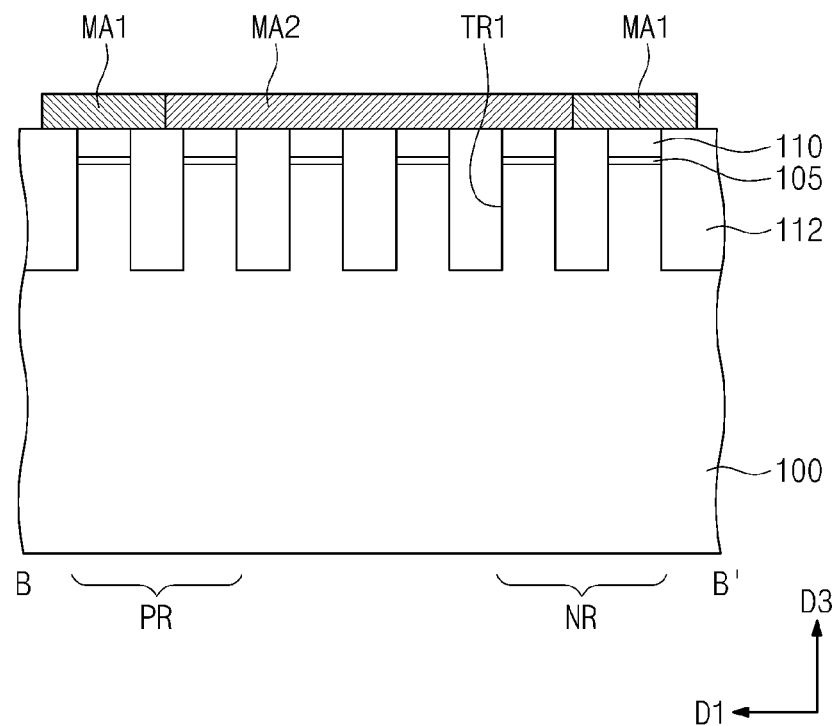
Figure 4D:
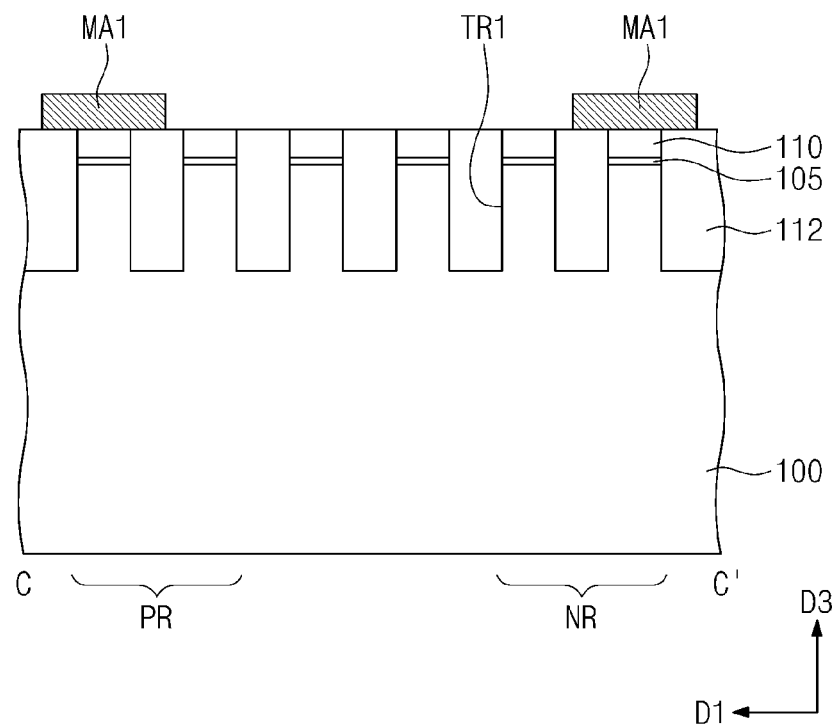

FIG. 1 is a plan view or layout of a semiconductor device that can be manufactured in accordance with the inventive concept. Referring to FIG. 1, a semiconductor device may include at least one active region (e.g., a PMOS region PR and/or an NMOS region NR) formed on a substrate 100. For example, the PMOS region PR and the NMOS region NR may be formed to have a shape which is not merely tetragonal but rather a shape of a rectilinear polygon having more than four sides. Here, as well as in common usage, a rectilinear polygon refers to a polygon whose sides each extend in either of two directions orthogonal to each other and thus, may also be referred to as an orthogonal polygon. The shapes of the PMOS region PR and the NMOS region NR shown in FIG. 1 are only illustrative, though. and to aid in explaining the inventive concept, i.e., the inventive concept is not limited to the manufacture of a semiconductor device having an active region(s) in the shape illustrated in FIG. 1.

In general, as the resolution of a semiconductor manufacturing process increases, a desired right angle at a corner(s) of an active region is not formed. That is, a rounding phenomenon (i.e., a corner rounding) may occur in an active region where right-angled corners are desired and the corner rounding is illustrated by CR1, CR2 and CR3 in FIG. 1. Especially, in the case of forming an active region having a width along a first direction D1 which increases from s1 to s2 or decreases from s2 to s1, the corner rounding may be rather pronounced so as to create a serious problem in the final device.

However, according to examples of the inventive concept, a corner rounding (e.g., CR1) that may occur in an active region is removed using a separate cutting mask (not illustrated). A corner rounding that may occur at a position where a width of an active region changes (e.g., the CR2 at which a width of the active region changes from s1 to s2 and the CR3 at which a width of the active region changes from s2 to s1) may be removed by forming an active region using at least two masks. A detailed manufacturing method of a semiconductor device will be described with reference to FIG. 2.

FIGS. 2A, 3A, 4A, 5A, 6A, 7A, 8A, 9A, 10A and 11A are plan views for explaining examples of a method of manufacturing semiconductor device in accordance with the inventive concept. FIGS. 2B, 3B, 4B, 5B, 6B, 7B, 8B, 9B, 10B and 11B are cross-sectional views taken along respective lines A-A' of the FIGS. 2A, 3A, 4A, 5A, 6A, 7A, 8A, 9A, 10A and 11A. FIGS. 2C, 3C, 4C, 5C, 6C, 7C, 8C, 9C, 10C and 11C are cross-sectional views taken along respective lines B-B' of the FIGS. 2A, 3A, 4A, 5A, 6A, 7A, 8A, 9A, 10A and 11A. FIGS. 2D, 3D, 4D, 5D, 6D, 7D, 8D, 9D, 10D and 11D are cross-sectional views taken along respective lines C-C' of the FIGS. 2A, 3A, 4A, 5A, 6A, 7A, 8A, 9A, 10A and 11A.

Referring to FIGS. 2A through 2D, active patterns (AP) may be formed by patterning a substrate 100. For example, the substrate 100 may be a silicon substrate, a germanium substrate, or a SOI (silicon on insulator) substrate. The active patterns (AP) may have a line or bar shape each extending in a second direction D2, perpendicular to the first direction D1, along a top surface of the substrate 100 and spaced apart from each other in the first direction D1, so at to be parallel to each other. Note, the terms first direction and second direction are for reference only and may be used interchangeably but consistently with respect to relative orientations of the features being described. That is, the first direction D1 shown in the drawings may at times be referred to as a second direction in which case the second direction D2 will be referred to as a first direction.

The forming of the active patterns (AP) may include forming first trenches TR1 that define the active patterns (AP) by etching an upper portion of the substrate 100. A depth of the first trenches TR1 may be greater than a width of the active patterns (AP).

The forming the first trenches TR1 may include forming a mask 110 (or simply "mask") on the substrate 100, and then anisotropically etching the substrate 100 using the mask 110 as an etch mask. For example, the mask 110 may include a plurality of layers sequentially stacked while having an etching selectivity with respect to one another. The mask 110 may include a silicon nitride layer. Before the mask 110 is formed, a buffer layer 105 may be formed on the substrate 100. The buffer layer 105 may include a silicon oxide layer or a silicon nitride layer.

Referring to FIGS. 3A through 3D, a first insulating layer 112 filling the first trenches TR1 may be formed. The first insulating layer 112 may be formed so that top surfaces of the mask 110 are exposed. The first insulating layer 112 may include a silicon oxide layer. The first insulating layer 112 may be a flowable chemical vapor deposition (FCVD) oxide layer. The forming the first insulating layer may include depositing the first insulating layer 112 on an entire surface of the substrate 100, and then planarizing the first insulating layer 112 until the mask 110 is exposed.

First mask patterns MA1 may be formed on the first insulating layer 112. The first mask patterns MA1 may have the shape of a rectilinear polygon. For example, the first mask patterns MA1 may have a line or bar shape extending in the second direction D2. The first mask patterns MA1 may be disposed along the first direction D1 perpendicular to the second direction D2.

Each of the first mask patterns MA1 may vertically overlap at least one active pattern (AP). Although the drawings illustrate that each of the first mask patterns MA1 vertically overlaps one active pattern (AP), each of the first mask patterns MA1 may vertically overlap two or more active patterns (AP). Although the drawings illustrate that each of the first mask patterns MA1 vertically overlaps an entire portion of one active pattern (AP), each of the first mask patterns MA1 may overlap a portion of one active pattern (AP). Each of the first mask patterns MA1 may include a plurality of layers sequentially stacked while having an etching selectivity with respect to one another. The first mask patterns MA1 may be a photoresist pattern.

A dummy layer 115 may be formed on the mask 110 and the first insulating layer 112. The forming of the dummy layer 115 may include forming a dummy layer covering the mask 110, the first insulating layer 112, and the first mask patterns MA1, and then planarizing the dummy layer until the dummy layer reaches top surfaces of the first mask patterns MA1.

A second mask pattern MA2 may be formed on the dummy layer 115. The second mask pattern MA2 may extend in the first direction D1 and span the first mask patterns MA1 as viewed in plan. Thus, sides of the second mask pattern MA2 extending in the first direction subtend respective right angles with sides of the first mask patterns MA1 which face each other and extend in the second direction D2 parallel to the active patterns AP. In this example, the second mask pattern MA2 vertically overlaps each of the first mask patterns MA1.

After the second mask pattern MA2 is formed, the dummy layer 115 may be selectively removed. A corner R2 is formed at a position where the first mask patterns MA1 and the second mask pattern MA2 overlap each other as illustrated in the drawing. Because an etching process is performed using the plurality of mask patterns MA1 and MA2, the corner rounding described with reference to FIG. 1 may be prevented.

In the example illustrated in FIGS. 3A through 3D, the plurality of mask patterns MA1 and MA2 are formed on different layers. However, the plurality of mask patterns MA1 and MA2 may be formed at the same level from the substrate. This will be described in detail with reference to FIGS. 4A through 4D.

Referring to FIGS. 4A through 4D, the first insulating layer 112 filling the first trenches TR1 may be formed. The first insulating layer 112 may be formed so that top surfaces of the mask 110 are exposed. The first insulating layer 112 may include a silicon oxide layer. The first insulating layer 112 may be a flowable chemical vapor deposition (FCVD) oxide layer. The forming of the first insulating layer may include depositing the first insulating layer 112 on an entire surface of the substrate 100, and then planarizing the first insulating layer 112 until the mask 110 is exposed.

First mask patterns MA1 may be formed on the first insulating layer 112. The first mask patterns MA1 may have a line or bar shape extending in the second direction D2. The first mask patterns MA1 may be disposed along the first direction D1 perpendicular to the second direction D2.

Each of the first mask patterns MA1 may vertically overlap at least one active pattern (AP). Although the drawings illustrate that each of the first mask patterns MA1 vertically overlaps one active pattern (AP), each of the first mask patterns MA1 may vertically overlap two or more active patterns (AP). Although the drawings illustrate that each of the first mask patterns MA1 vertically overlaps an entire portion of one active pattern (AP), each of the first mask patterns MA1 may overlap a portion of one active pattern (AP). Each of the first mask patterns MA1 may include a plurality of layers sequentially stacked while having an etching selectivity with respect to one another. The first mask patterns MA1 may be a photoresist pattern.

A second mask pattern MA2 may be formed on the first insulating layer 112. The second mask pattern MA2 may extend in the first direction D1. In this case, the second mask pattern MA2 may be formed not to overlap the first mask pattern MA1. The second mask pattern MA2 may be formed to be adjacent to the first mask patterns MA1. As illustrated in the drawings, a corner R2 is formed at a position where the first mask patterns MA1 and the second mask pattern MA2 meet each other. Because an etching process is performed using the plurality of mask patterns MA1 and MA2, the corner rounding may be prevented.

Figure 5A:
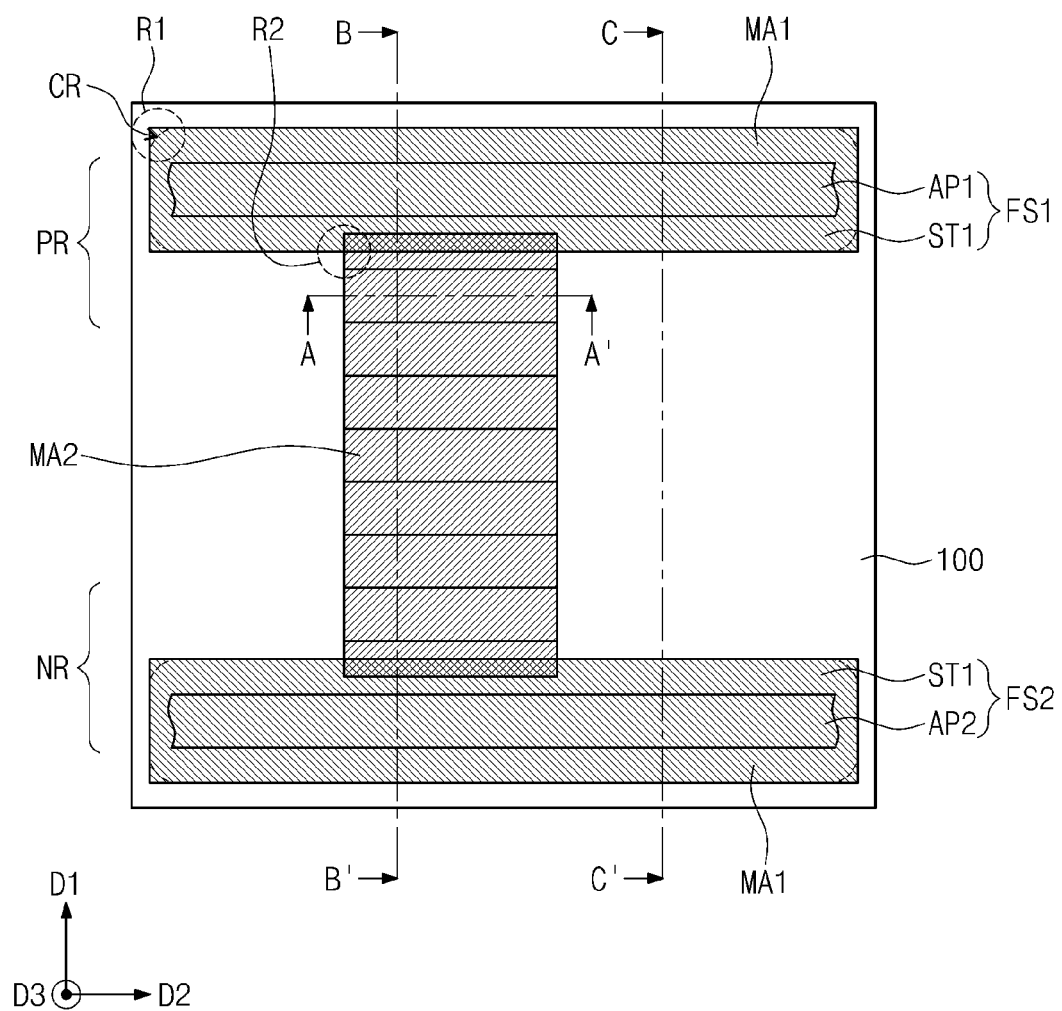
Figure 5B:
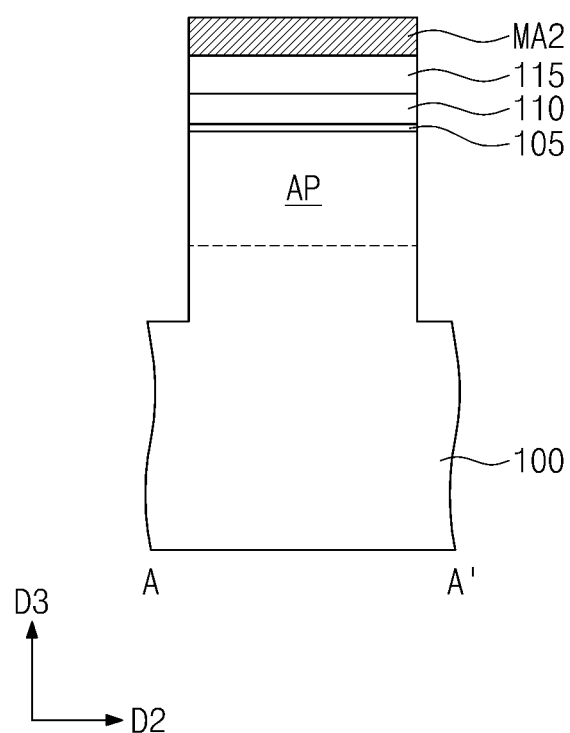
Figure 5C:
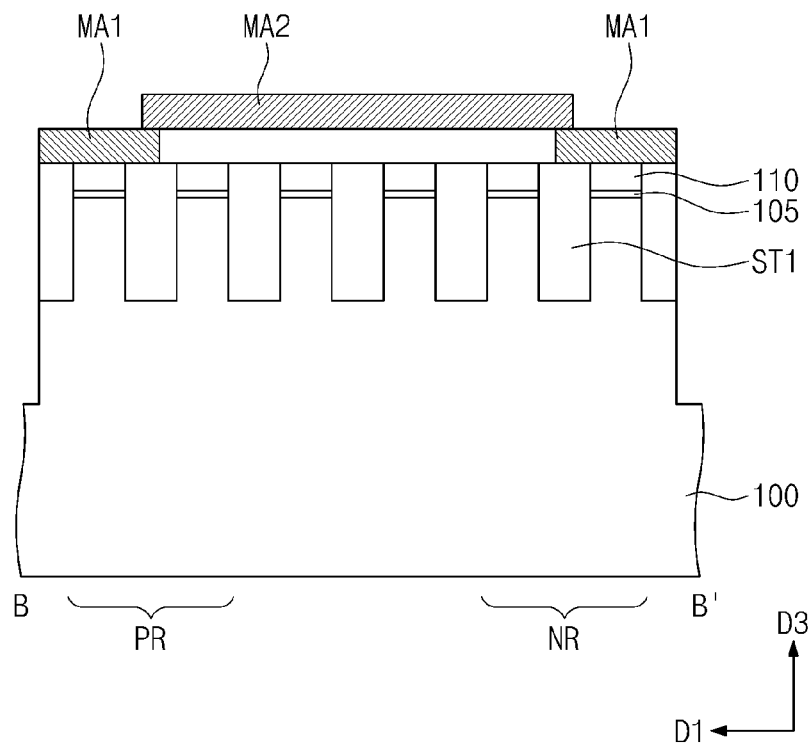
Figure 5D:
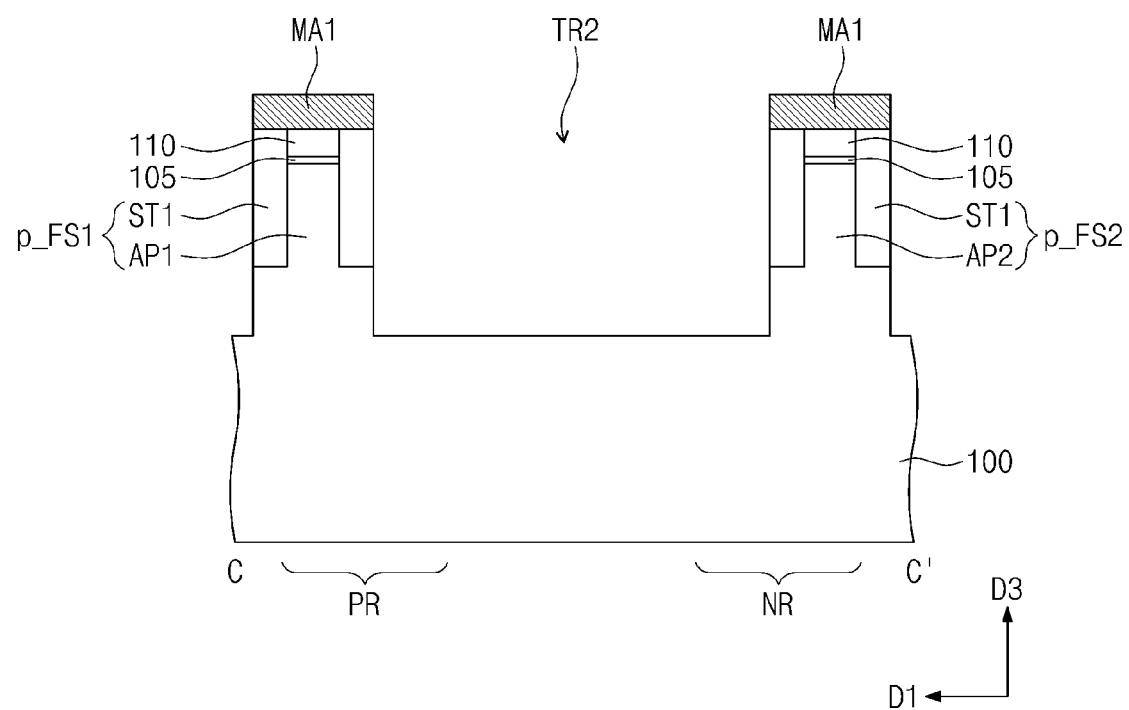
Figure 6A:
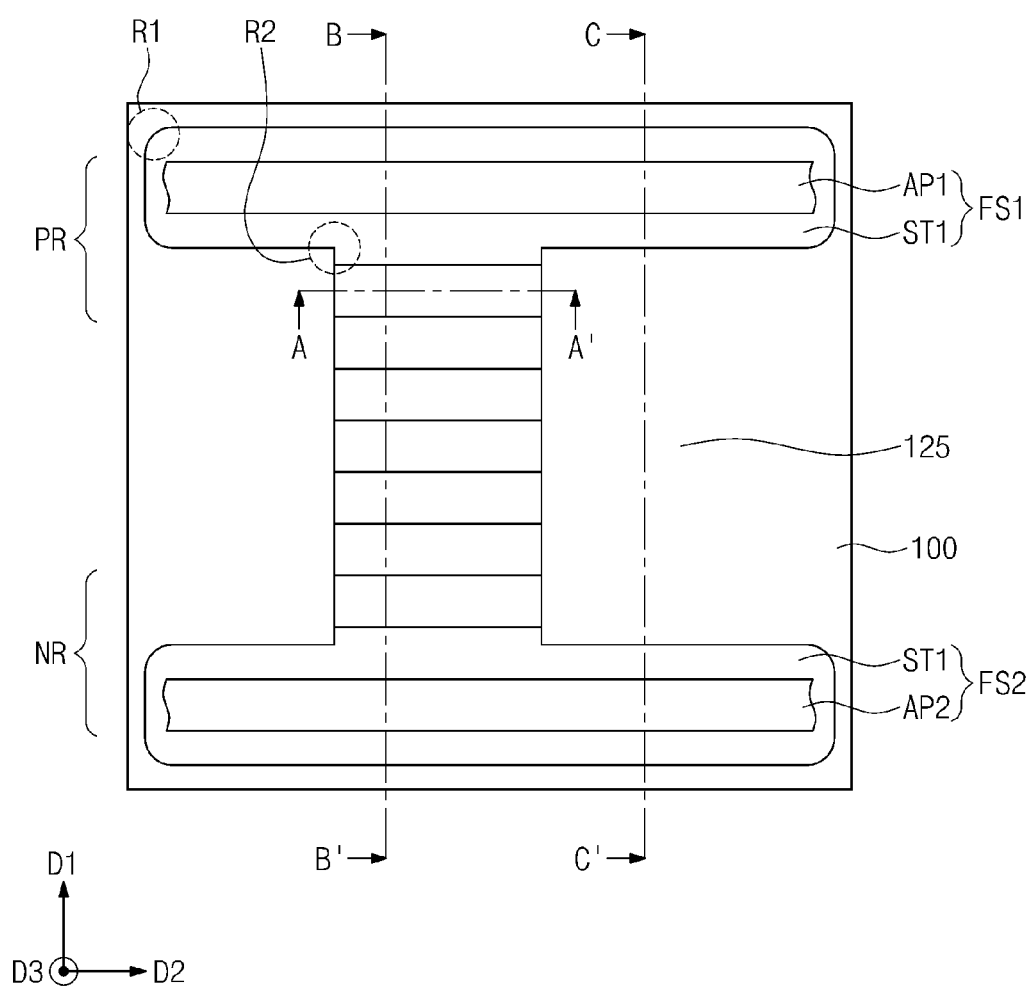
Figure 6B:
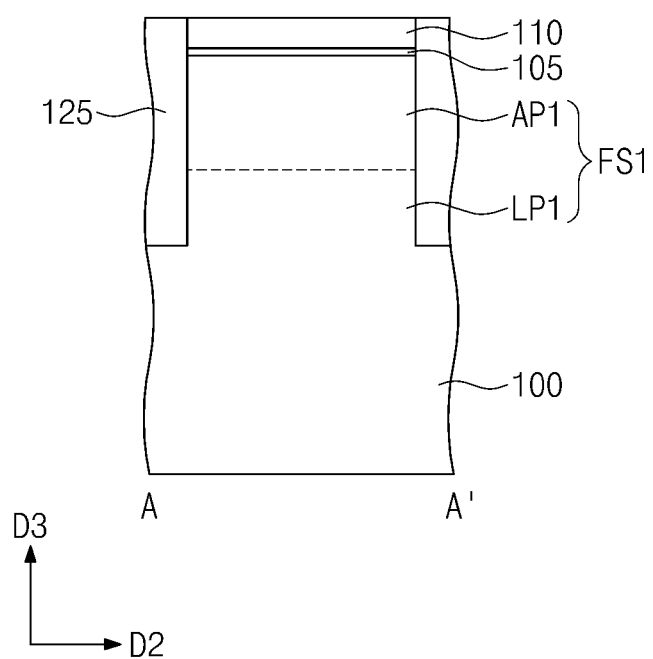
Figure 6C:
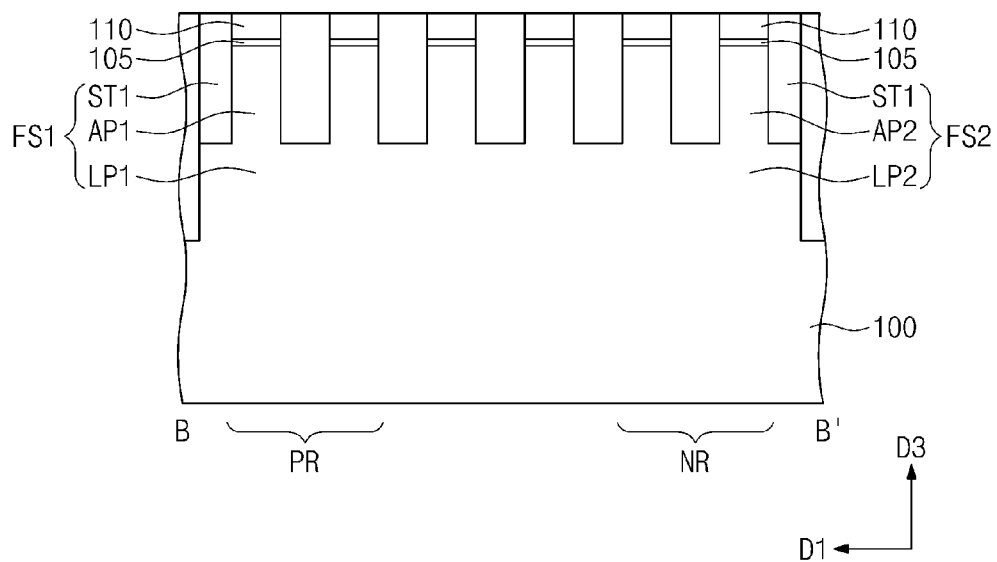
Figure 6D:
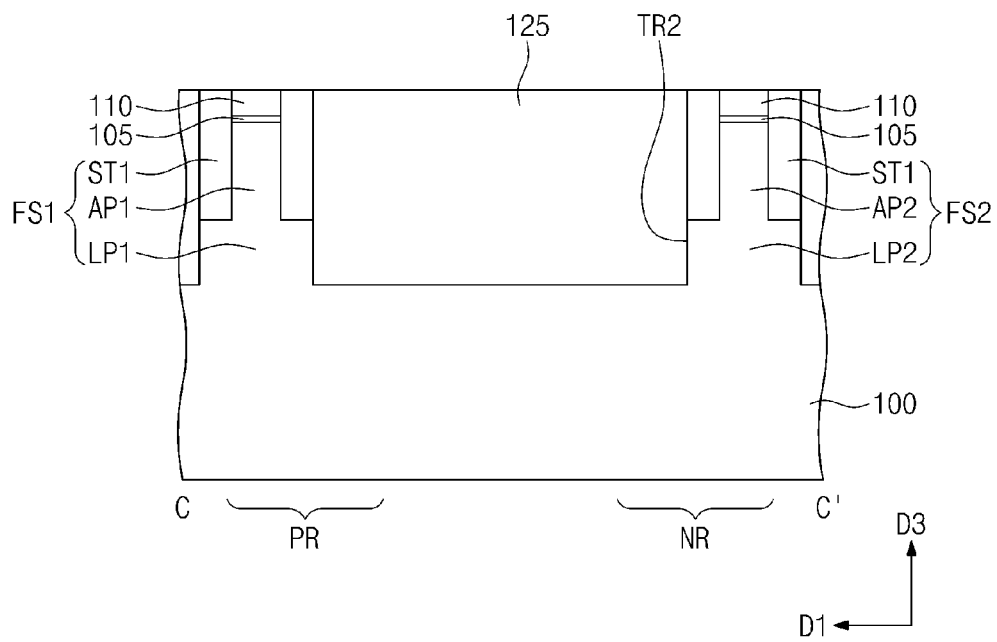
Figure 7A:
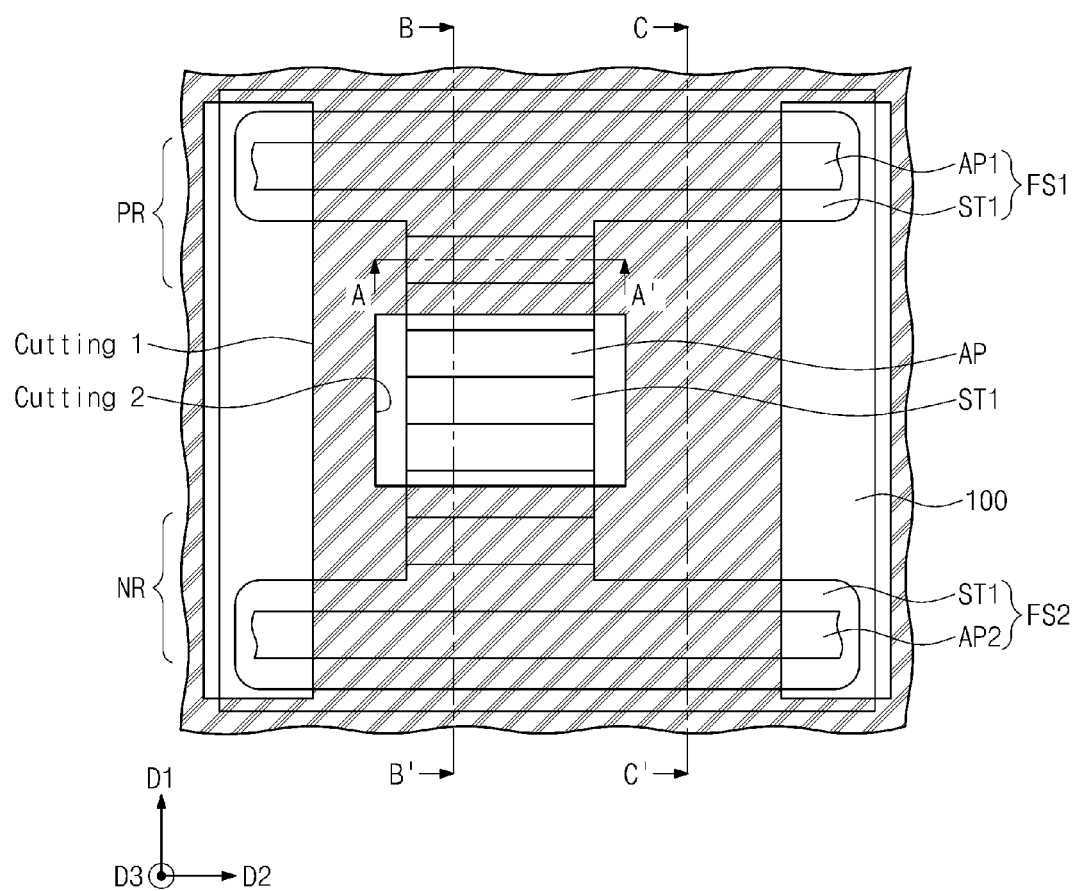
Figure 7B:
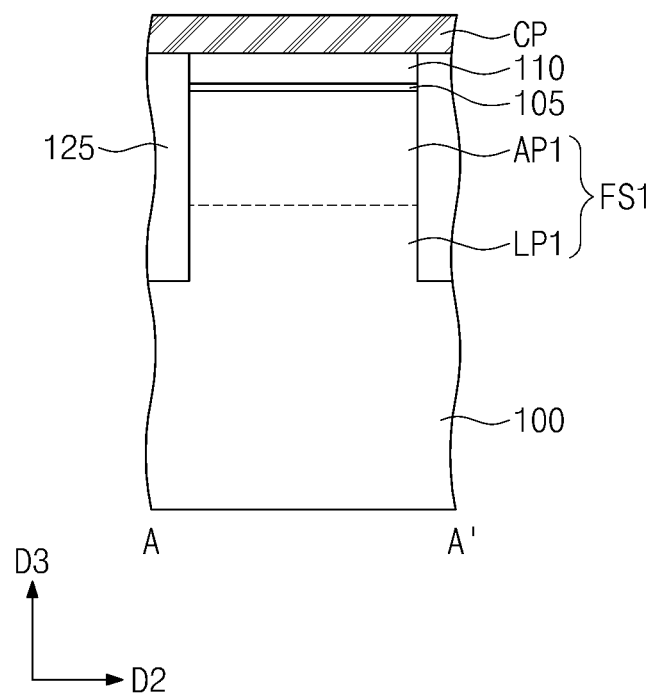
Figure 7C:
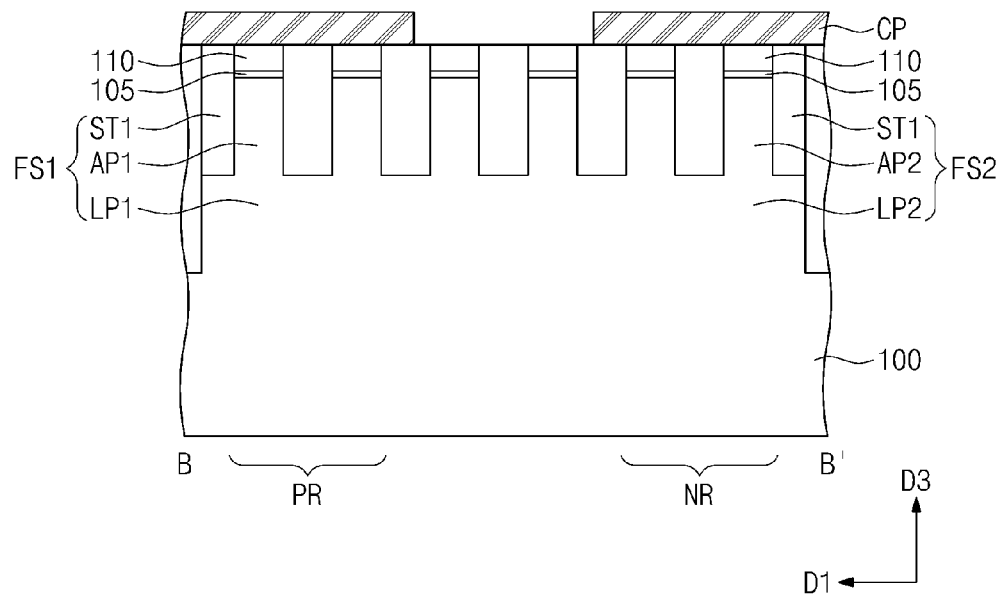
Figure 7D:
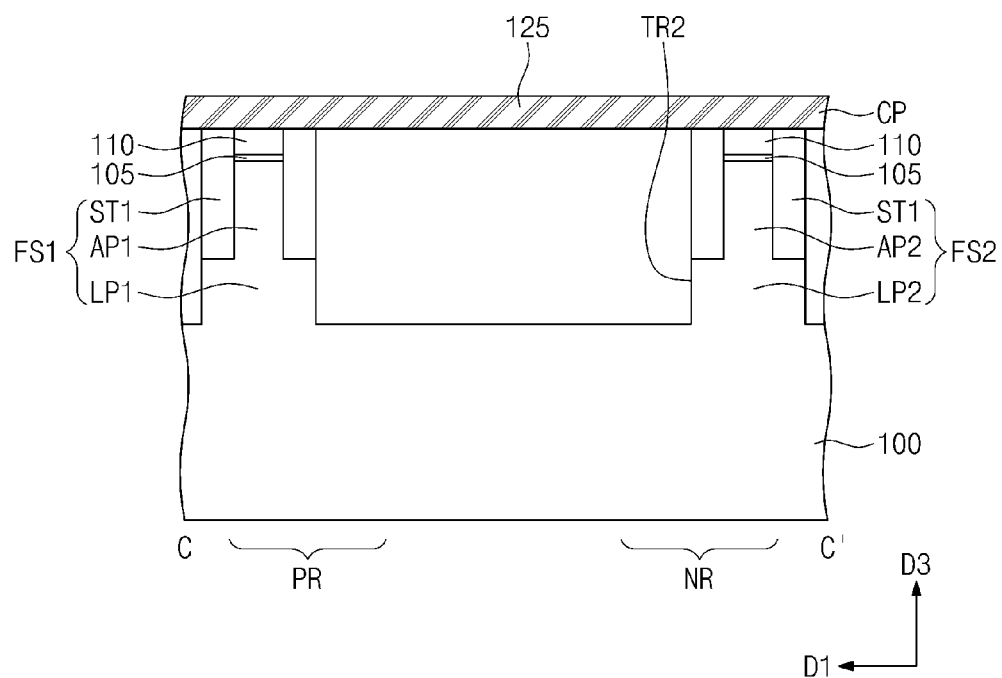
Figure 8A:
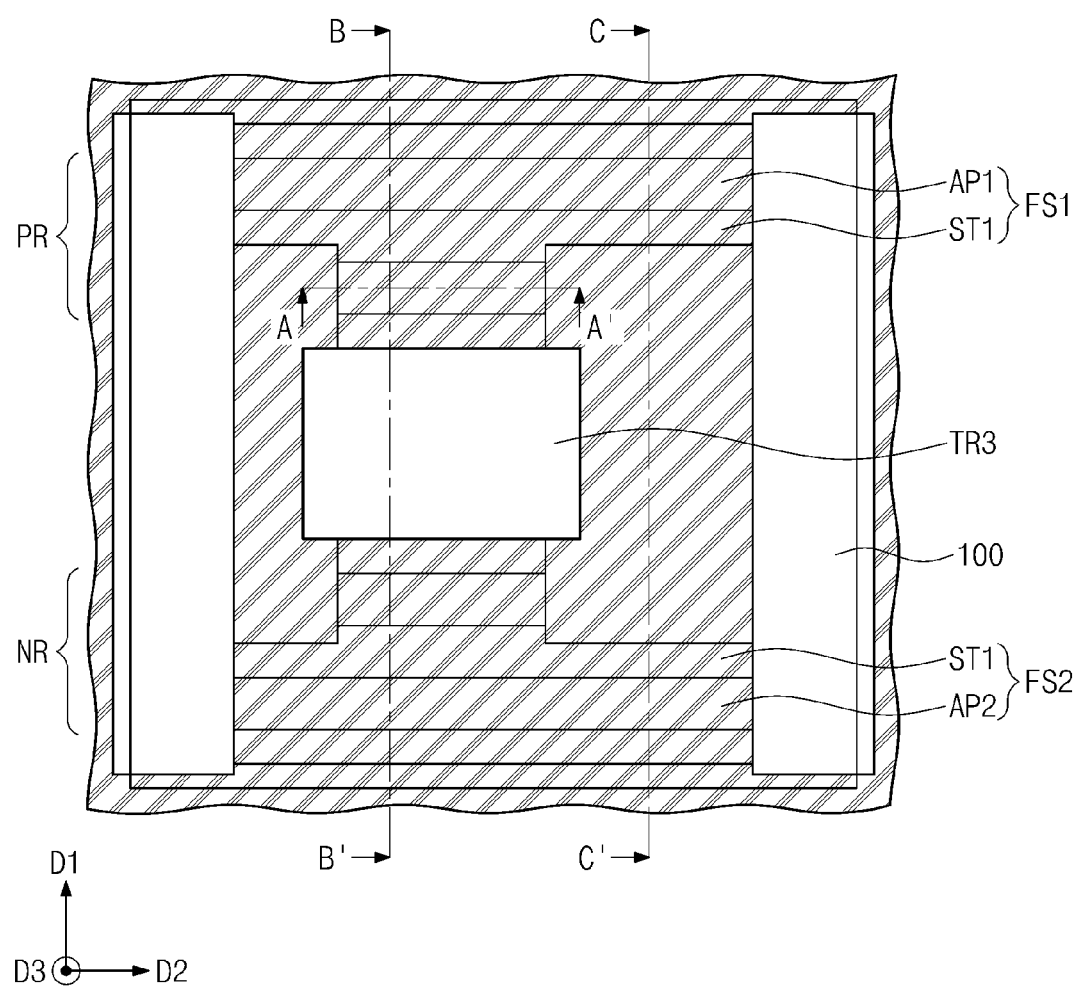
Figure 8B:
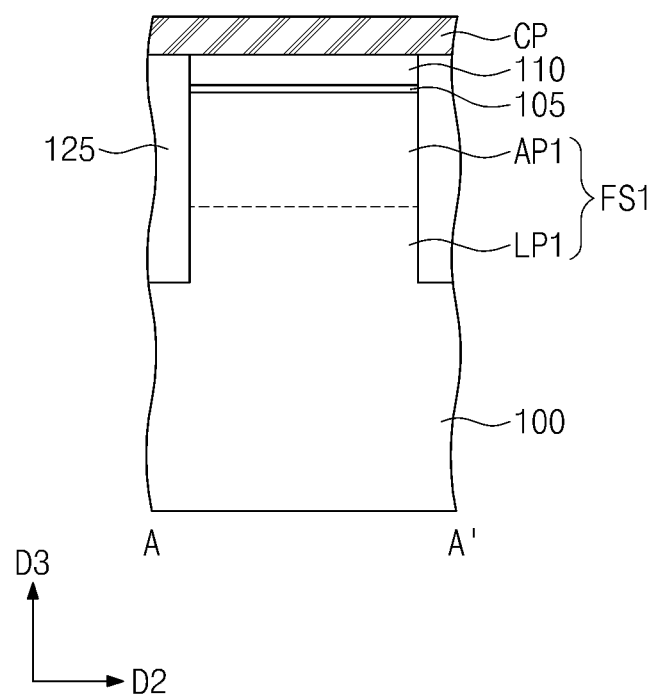
Figure 8C:
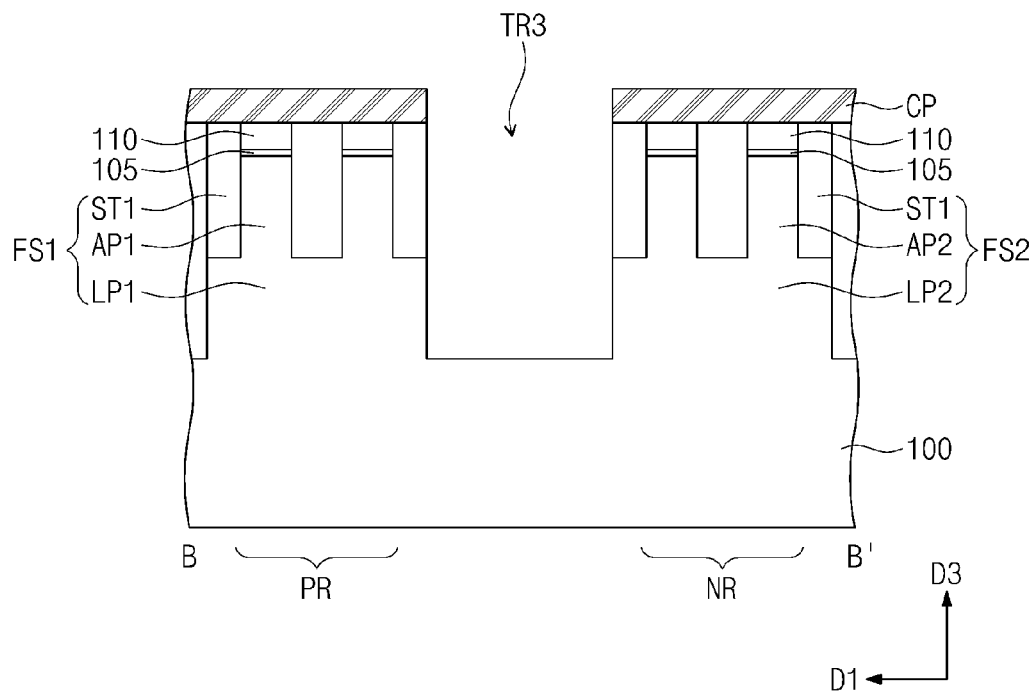
Figure 8D:
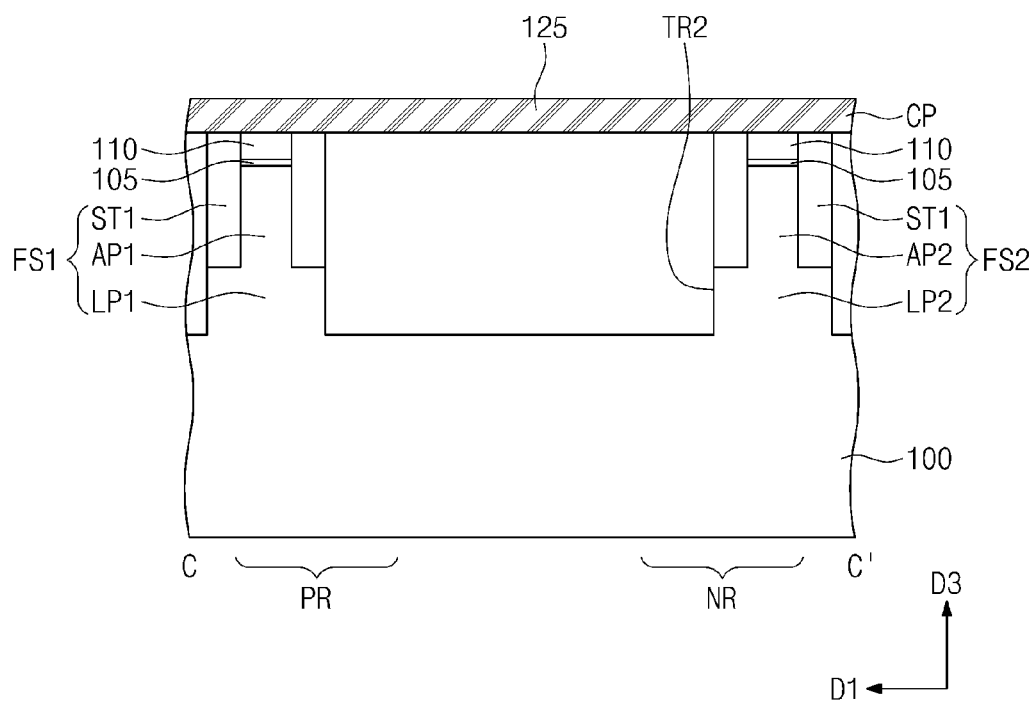
Figure 9A:
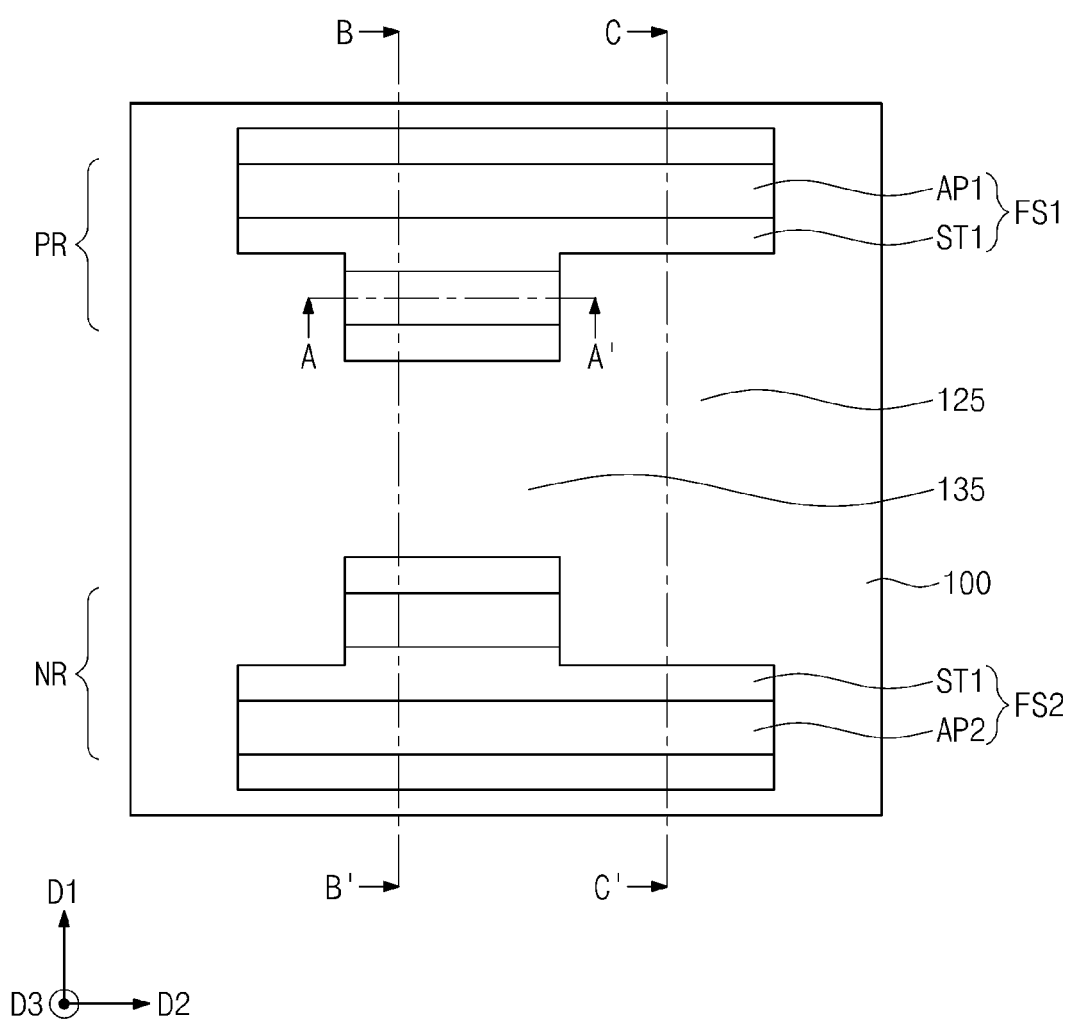
Figure 9B:
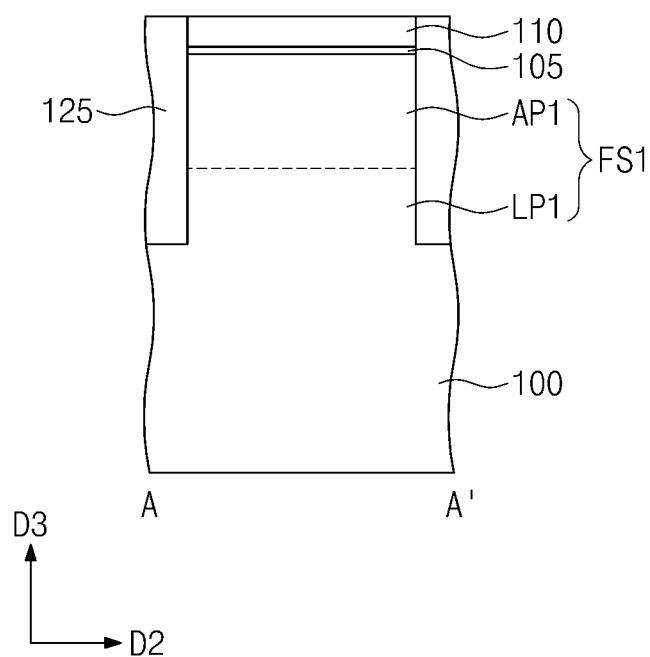
Figure 9C:
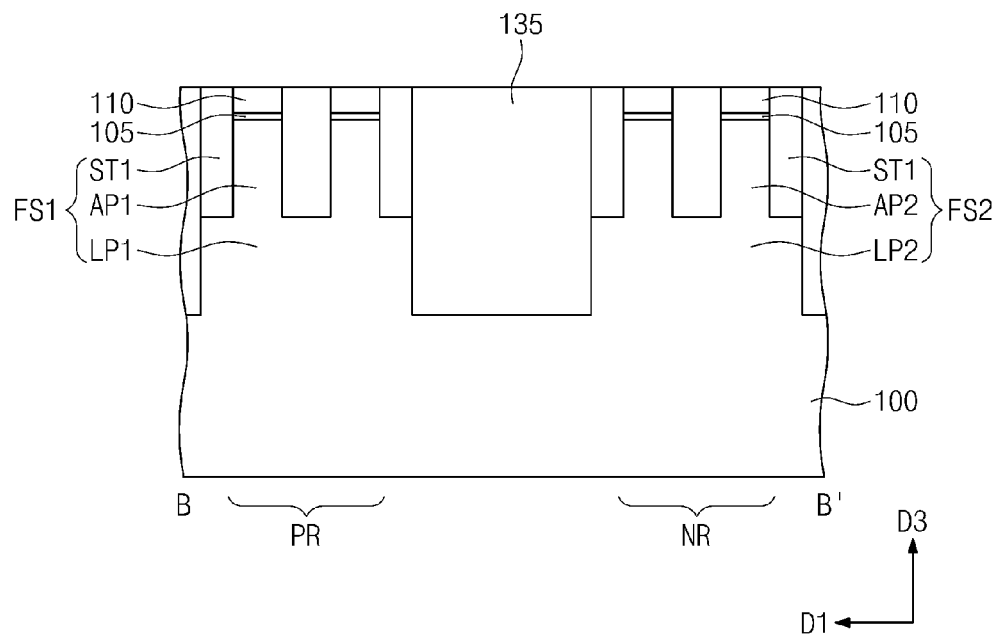
Figure 9D:
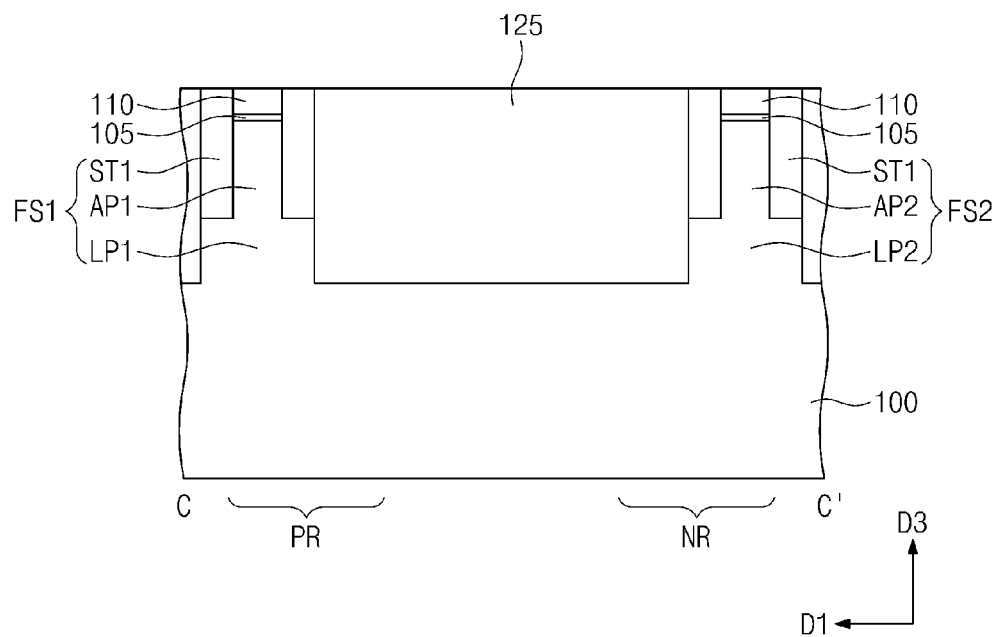
Figure 10A:
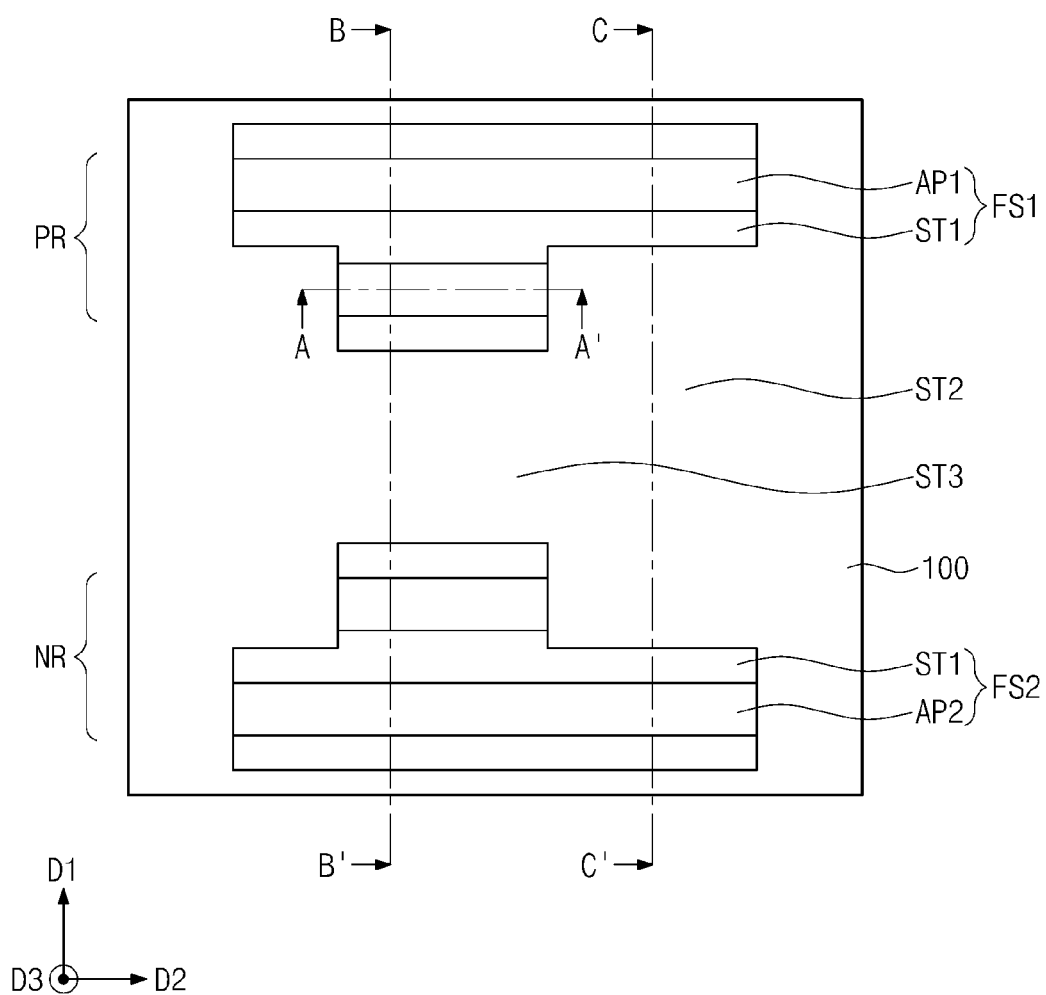
Figure 10B:
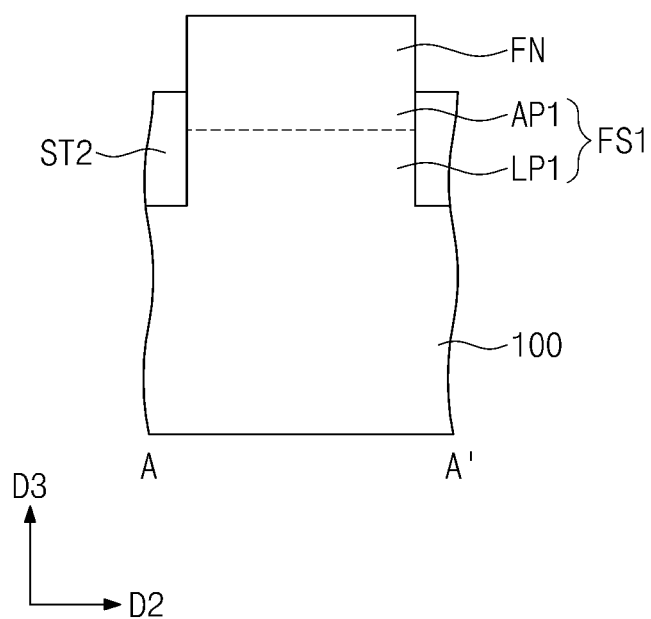
Figure 10C:
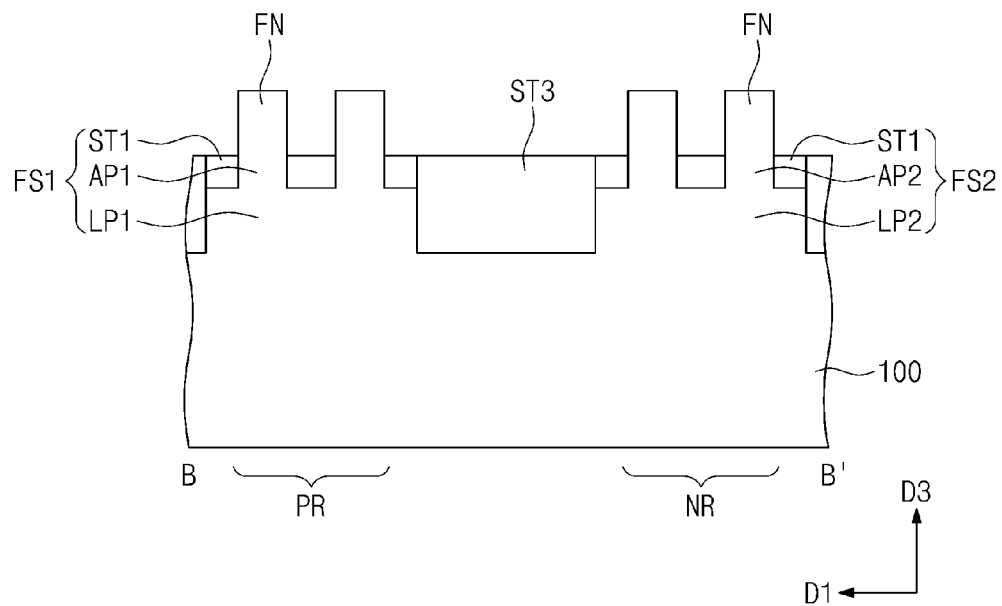
Figure 10D:
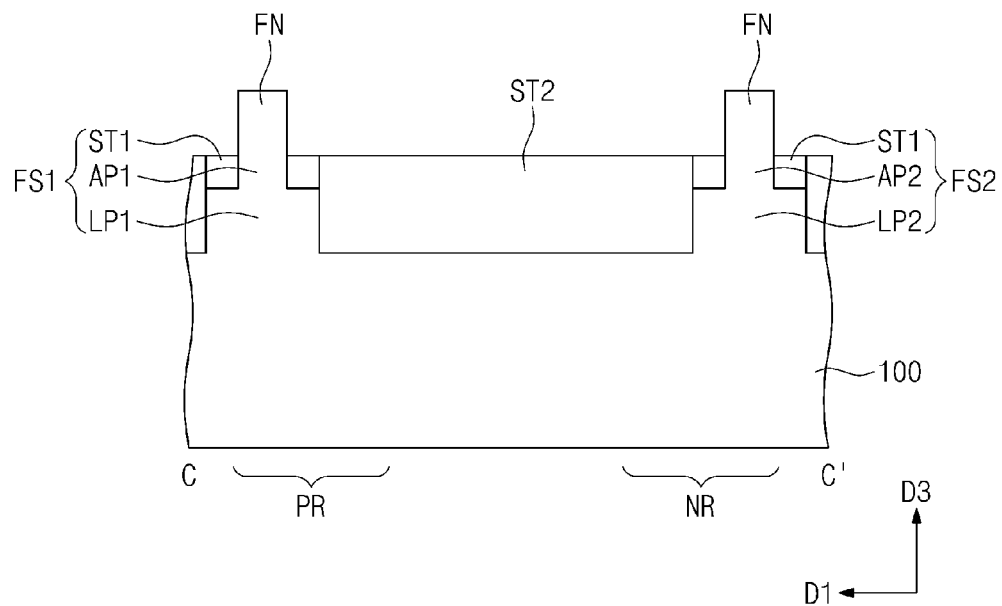
Figure 11A:
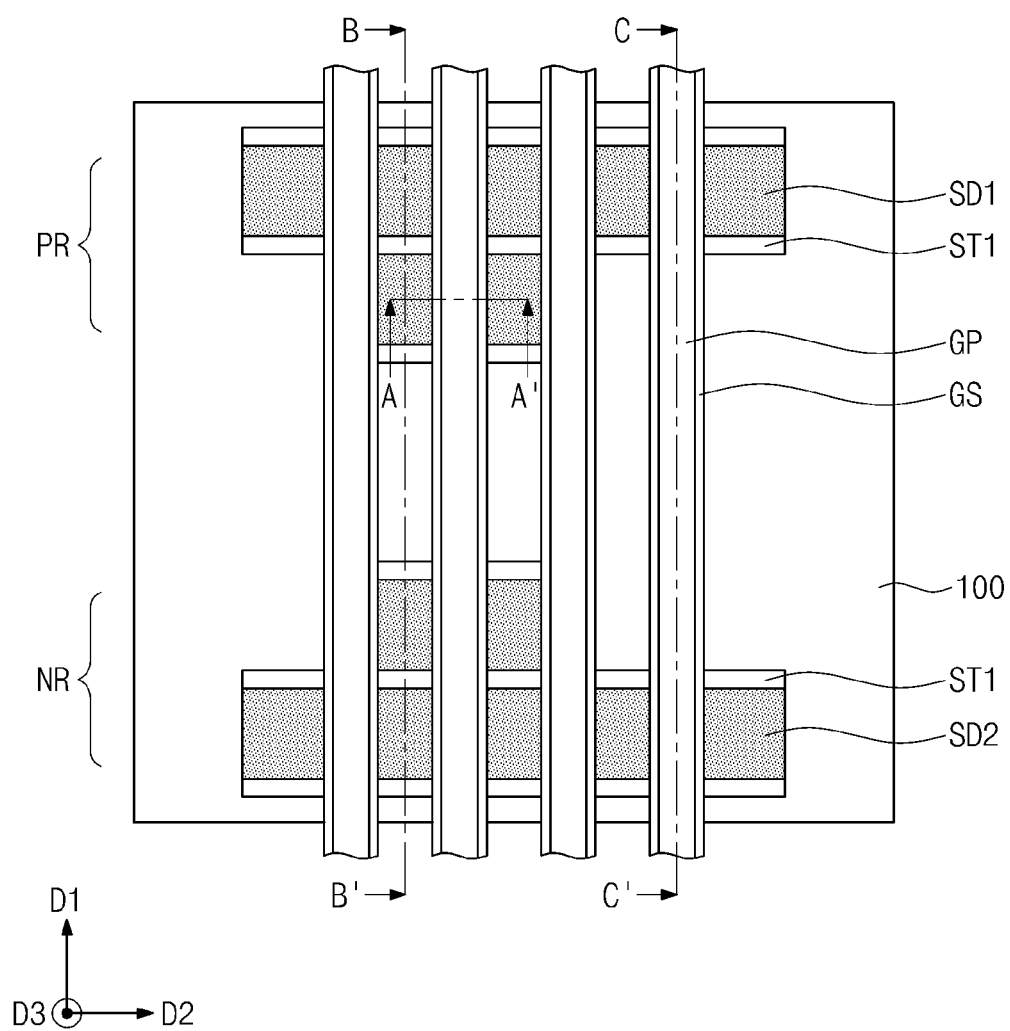
Figure 11B:
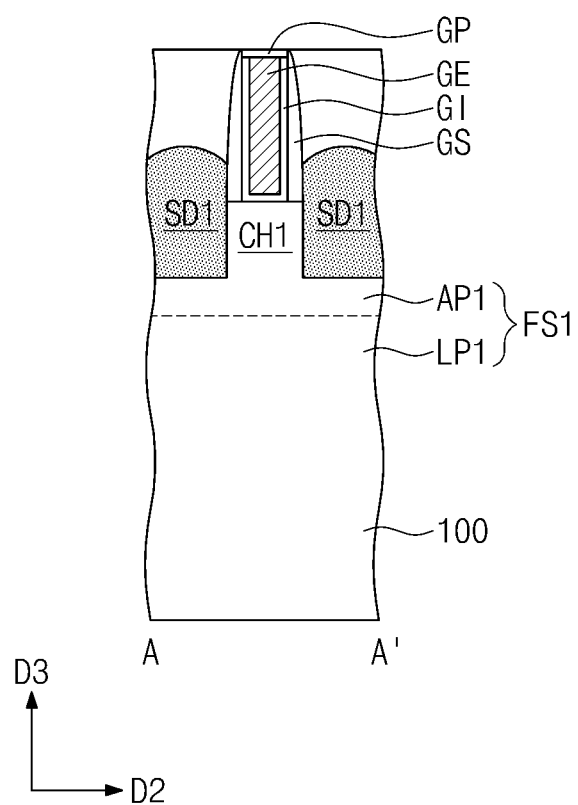
Figure 11C:
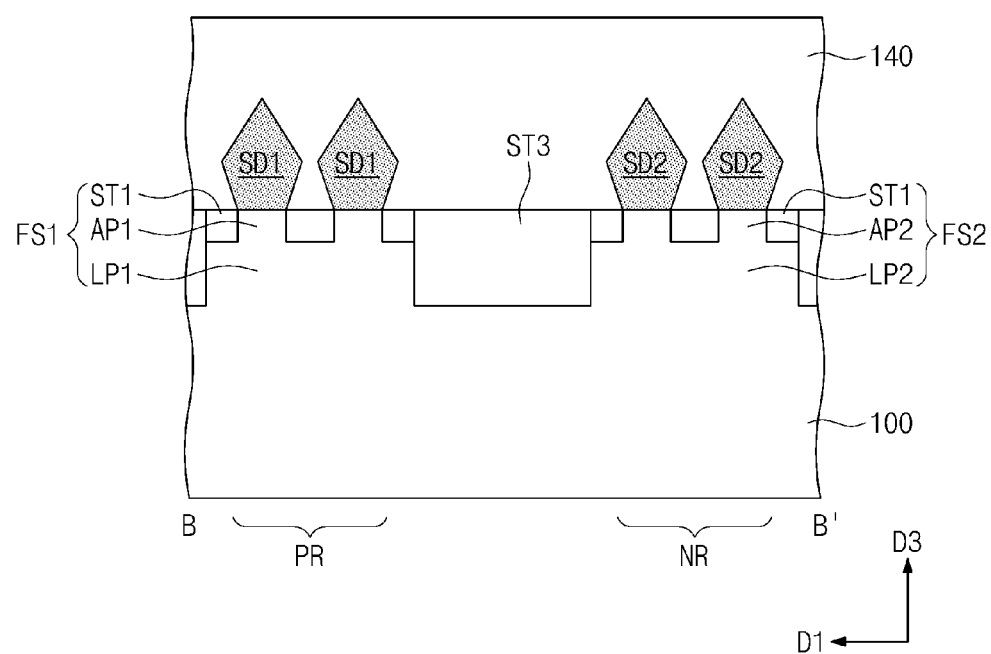
Figure 11D:
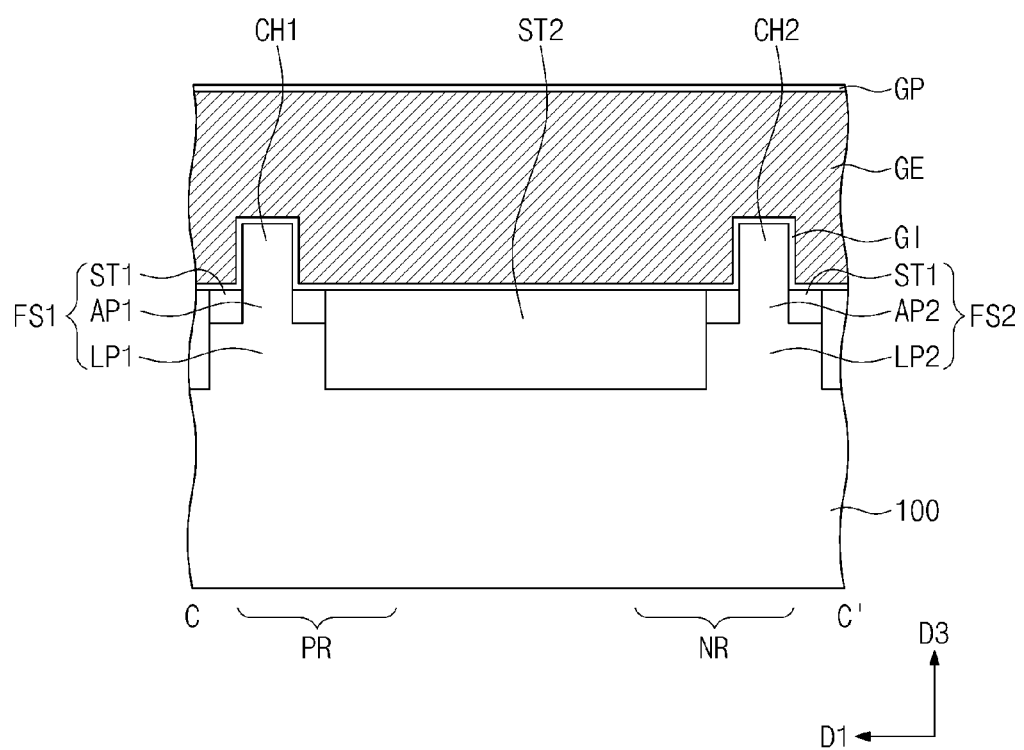

Referring to FIGS. 5A and 5D, preliminary fin structures p_FS1 and p_FS2, and a second trench TR2 that defines a PMOS region PR and an NMOS region NR may be formed by performing a first etching process. The first etching process may include etching the mask 110, the buffer layer 105, the active patterns (AP), and first insulating layer 112 using the second mask pattern MA2 as an etch mask. As a result of the first etching process, the preliminary fin structures p_FS1 and p_FS2 may be formed. For example, the preliminary fin structure p_FS1 formed on the PMOS region PR may include an active pattern AP1 and a pair of first device isolation patterns ST1 disposed on both sides of the active pattern AP1. The preliminary fin structure p_FS2 formed on the NMOS region NR may include an active pattern AP2 and a pair of first device isolation patterns ST1 disposed on both sides of the active pattern AP2.

During the first etching process, active patterns (AP) exposed by the first mask patterns MA1 and the second mask pattern MA2 may be removed. A part of the first insulating layer 112 exposed by the first mask patterns MA1 and the second mask pattern MA2 may be removed. The part of the first insulating layer 112 and the active patterns (AP) are removed and as a result, the second trench TR2 that partly defines the PMOS region PR and the NMOS region NR is formed (and either or both of which may be referred to as a "partly defined active region"). As another result, the preliminary fin structure p_FS1 on the PMOS region PR and the preliminary fin structure p_FS2 on the NMOS region NR may be additionally defined.

According to examples of the inventive concept, because an etching process is performed using the plurality of mask patterns MA1 and MA2, a corner rounding does not occur at a position where the first mask patterns MA1 and the second mask pattern MA2 meet each other as viewed in plan (either overlap when provided on different levels or butt against each other when provided at the same level, for example). A corner rounding may still occur at (or more precisely in the portion of the partly defined active region directly below) a corner (e.g., R1) of the first mask patterns MA1. A method of removing the corner rounding will be described in detail below.

Referring to FIGS. 6A through 6D, the first mask patterns MA1 and the second mask pattern MA2 may be removed.

A second insulating layer 125 filling the second trench TR2 may be formed. The second insulating layer 125 may be formed so that a top surface of the mask 110 is exposed. For example, the second insulating layer 125 may include a silicon oxide layer. The second insulating layer 125 may include at least one of a high density plasma (HDP) oxide layer, TEOS (tetraethyl orthosilicate), PE-TEOS (plasma enhanced tetraethyl orthosilicate), O3-TEOS (O3-tetraethyl orthosilicate), USG (undoped silicate glass), PSG (phosphosilicate glass), BSG (borosilicate glass), BPSG (borophosphosilicate glass), FSG (fluoride silicate glass), and SOG (spin on glass).

For example, the forming of the second insulating layer 125 may include depositing the second insulating layer 125 on an entire surface of the substrate 100 and then planarizing the second insulating layer 125 until the mask 110 is exposed.

Referring to FIGS. 7A through 7D, a cutting mask (CP) may be formed on the mask 110, the first device isolation patterns ST1 and the second insulating layer 125. For example, the cutting mask (CP) may include a plurality of layers sequentially stacked while having an etching selectivity with respect to one another. The cutting mask (CP) may be a photoresist pattern.

As illustrated in the drawings, the cutting mask (CP) may be formed to have openings such that a portion to be cut is exposed. For example, one opening of the cutting mask (CP) is located over one or more rounded corners of the partially defined active region exposed in a first cutting region (cutting 1) so that the rounded corner(s) may be removed through a second etching process. Another opening in the cutting mask (CP) may be located over the active patterns (AP) and the first device isolation patterns ST1 exposed in a second cutting region (cutting 2) so that those active patterns (AP) and isolation patterns ST1 are removed thereby creating the separation between the PMOS region PR and the NMOS region NR.

Referring to FIGS. 8A through 8D, a third trench TR3 that defines the PMOS region PR and the NMOS region NR may be formed by performing the second etching process. While the PMOS region PR and the NMOS region NR are partly formed/defined by the first etching process, the PMOS region PR and the NMOS region NR may be completed by the second etching process. The second etching process may include etching the mask 110, the buffer layer 105, the active patterns (AP) and the first insulating layer 112 using the cutting mask (CP) as an etch mask.

During the second etching process, active patterns (AP) exposed by the cutting mask (CP) may be removed. A portion of the first insulating layer 112 exposed by the cutting mask (CP) may be removed. The portion of the first insulating layer 112 and the active patterns (AP) are removed and as a result the third trench TR3 that completely defines the PMOS region PR and the NMOS region NR may be formed.

Referring to FIGS. 9A through 9D, the cutting mask (CP) may be removed.

A third insulating layer 135 filling the third trench TR3 may be formed. The third insulating layer 135 may be formed so that the mask 110 is exposed. For example, the third insulating layer 135 may include a silicon oxide layer. The third insulating layer 135 may include at least one of a high density plasma (HDP) oxide layer, TEOS (tetraethyl orthosilicate), PE-TEOS (plasma enhanced tetraethyl orthosilicate), 03-TEOS (03-tetraethyl orthosilicate), USG (undoped silicate glass), PSG (phosphosilicate glass), BSG (borosilicate glass), BPSG (borophosphosilicate glass), FSG (fluoride silicate glass), and SOG (spin on glass).

For example, the forming the third insulating layer 135 may include depositing the third insulating layer 135 on an entire surface of the substrate 100 and then planarizing the third insulating layer 135 until the mask 110 is exposed.

Referring to FIGS. 10A through 10D, a residual mask 110 may be removed. An upper portion of the second insulating layer 125 is removed and as a result, a second isolation pattern ST2 may be formed. An upper portion of the third insulating layer 135 is removed and as a result, a third isolation pattern ST3 may be formed. When the upper portion of the second insulating layer 125 and the upper portion of the third insulating layer 135 are removed, upper portions of the first device patterns ST1 and the buffer layer 105 are removed together and as a result, upper portions (FN) of the active patterns (AP1 and AP2) may be exposed.

Removing the upper portions of the second insulating layer 125 and the third insulating layer 135, upper portions of the first device patterns ST1, and the buffer layer 105 may include a dry etching process, for example. The dry etching process may have an etching selectivity with respect to silicon oxide.

Referring to FIGS. 11A through 11D, a first fin structure FS1 that protrudes in a direction D3 perpendicular to the substrate 100 may be formed on the PMOS region PR and a second fin structure FS2 that protrudes in a direction D3 perpendicular to the substrate 100 may be formed on the NMOS region NR.

The first fin structure FS1 may include a first lower pattern LP1, a plurality of first active patterns AP1 that protrudes in a direction perpendicular to the top surface of the first lower pattern LP1, and the first device isolation patterns ST1 covering both sidewalls of each of the first active patterns (AP1).

Gate electrodes GE crossing the active patterns (AP1 and AP2) to extend in the first direction D1 may be provided. The gate electrodes GE may be spaced apart from one another along the second direction D2. A gate insulating pattern G1 may be provided between the active patterns (AP1 and AP2) and each of the gate electrodes GE. Gate spacers GS may be provided on both sides of each of the gate electrodes GE. A capping pattern GP covering a top surface of each of the gate electrodes GE may be provided.

First source/drain patterns SD1 may be formed in upper portions of the first active patterns (AP1) between the gate electrodes GE, respectively. Second source/drain patterns SD2 may be formed in upper portions of the second active patterns (AP2) between the gate electrodes GE, respectively. For example, the first source/drain patterns SD1 may have p-type conductivity and the second source/drain patterns SD2 may have n-type conductivity. The first source/drain patterns SD1 may include an SiGe layer and the second source/drain patterns SD2 may include an Si layer or an SiC layer.

An interlayer insulating layer 140 covering the gate electrodes GE, the first source/drain patterns SD1 and the second source/drain patterns SD2, the first device isolation patterns ST1, the second device isolation patterns ST2, and the third device isolation patterns ST3 may be disposed on the substrate 100. Although not illustrated in the drawings, source/drain contacts may be further provided. The source/drain contacts may penetrate the interlayer insulating layer 140 to be electrically connected to the first source/drain patterns SD1 and the second source/drain patterns SD2, respectively.

FIGS. 1 and 2A through 11D illustrate examples of a method of manufacturing a FinFET in an active region of a varying width formed according to the inventive concept. However, the inventive concept is not limited to the manufacturing of a FinFET in an active region having the shape illustrated in these figures. Also, a method of manufacturing a semiconductor device using the plurality of mask patterns MA1 and MA2 and one cutting mask (CP) was described with reference to FIGS. 2A through 11D. However, a plurality of cutting masks (CP) may be used and more details will be provided below.

FIG. 12 is a plan view or layout of other examples of a semiconductor device in accordance with examples of the inventive concept. FIGS. 13 through 17 are plan views illustrating a method of manufacturing semiconductor devices having a layout as illustrated in FIG. 12.

Referring to FIG. 12, a first PMOS region PR1 and a first NMOS region NR1 provided on a substrate 100 each have a width in a first direction D1 which increases from s1 to s2 along a second direction D2, and a second PMOS region PR2 and a second NMOS region NR1 each having a width in the first direction D1 which decreases from s3 to s1 along the second direction D2.

Figure 13:
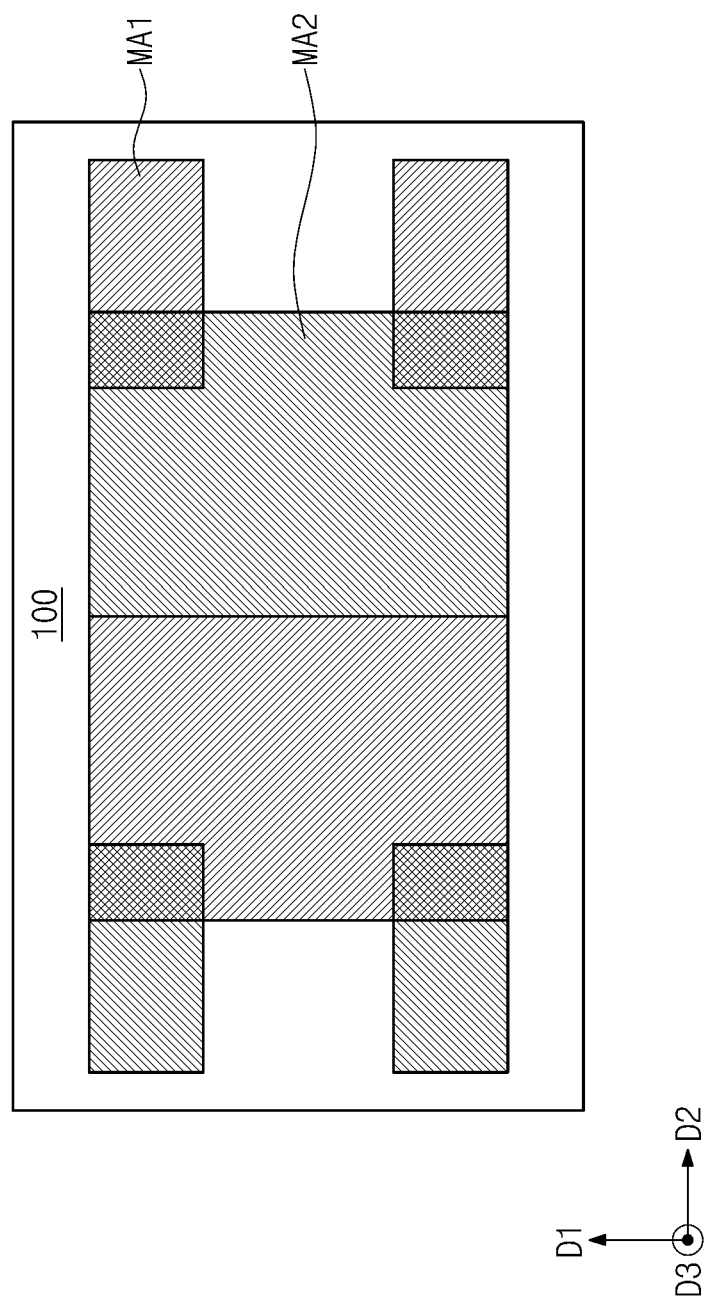
FIGS. 13, 14, 15, 16 and 17 are plan views of a semiconductor device during the course of its manufacture and having a layout as illustrated in FIG. 12, and which together illustrate a method of manufacturing the semiconductor device in accordance with the inventive concept.

Referring to FIG. 13, a plurality of mask patterns MA1 and MA2 may be formed. The first mask pattern MA1 may be provided to form a part having a width of s2 in the first PMOS region PR1, a part having a width of s2 in the first NMOS region NR1, a part having a width of s1 in the second PMOS region PR2, and a part having a width of s1 in the second NMOS region NR1. The second mask pattern MA2 may be provided to form a part having a width of s1 in the first PMOS region PR1, a part having a width of s1 in the first NMOS region NR1, a part having a width of s3 in the second PMOS region PR2, and a part having a width of s3 in the second NMOS region NR1.

Although the drawings illustrate that the first mask patterns MA1 and the second mask pattern MA2 overlap each other (such that they meet when viewed in plan), the first mask patterns MA1 and the second mask pattern MA2 may not overlap each other. That is, the first mask patterns MA1 and the second mask pattern MA2 may be disposed to be adjacent to each other (such that they also meet when viewed in plan but without overlapping). Because a method of forming the first mask patterns MA1 and the second mask pattern MA2 is similar to that described with reference FIGS. 3A through 3D or with reference to 4A through 4D, a detailed description thereof is omitted.

Figure 14:
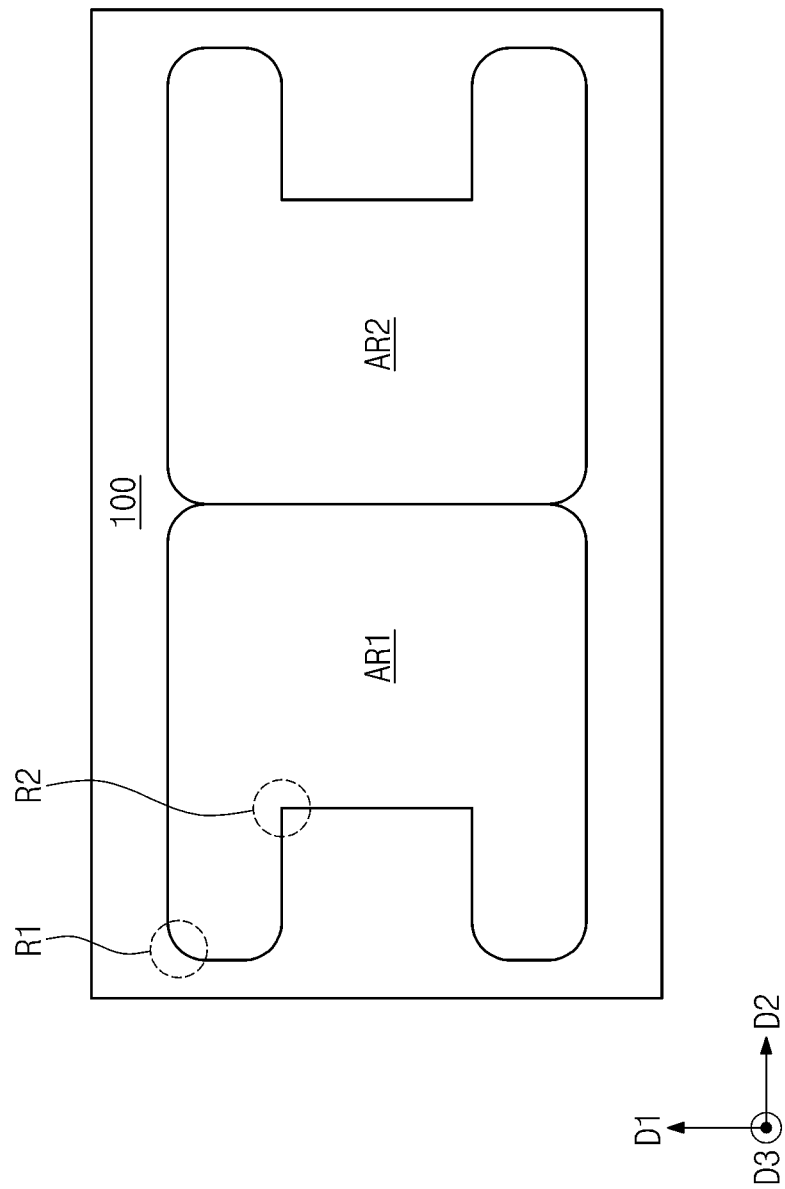

Referring to FIG. 14, a first etching process using the first mask patterns MA1 and the second mask pattern MA2 may be performed. Through the first etching process, trenches (not illustrated) may be formed that partly define preliminary fin structures, a first active region AR1 including the first PMOS region PR1 and the first NMOS region NR1, and a second active region AR2 including the second PMOS region PR2 and the second NMOS region NR2. Because the first etching process is similar to that described with reference to FIGS. 5A through 6D, a detailed description thereof is omitted.

According to the first etching process, a corner rounding does not occur at a position like R2 where the two mask patterns cross each other (or alternatively merely meet). However, a corner rounding may still occur at a position like R1 where the two mask patterns don't cross each other.

Figure 15:
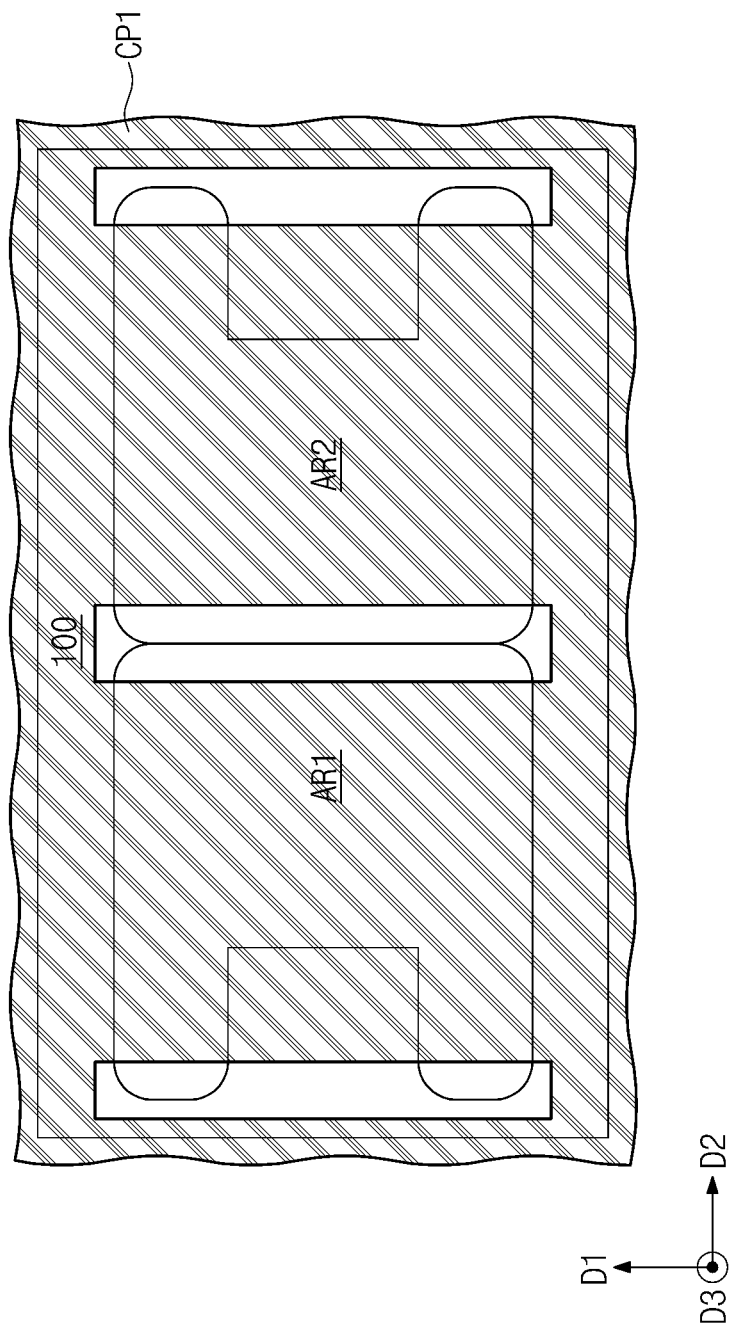

Referring to FIG. 15, a first cutting mask (CP1) may be formed. The first cutting mask (CP1) may be provided for use in cutting corner rounding parts of the first active region AR1 and the second active region AR2. Because a method of forming the first cutting mask (CP1) is similar to that described with reference to FIGS. 7A through 7D, a detailed description thereof is omitted.

Figure 16:
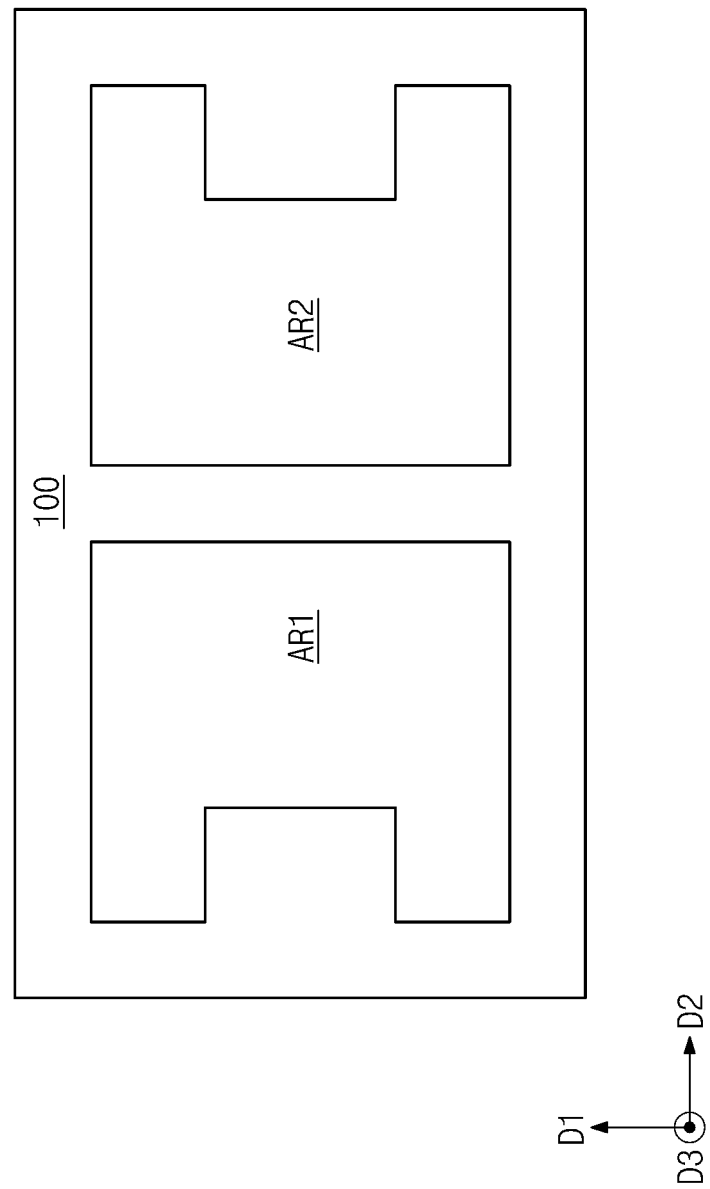

Referring to FIG. 16, a second etching process using the first cutting mask (CP1) may be performed. Through the second etching process, trenches (not illustrated), which partly define the first active region AR1 including the first PMOS region PR1 and the first NMOS region NR1, and the second active region AR2 including the second PMOS region PR2 and the second NMOS region NR2, may be formed. Because the second etching process is similar to that described with reference to FIGS. 8A through 8D, a detailed description thereof is omitted.

Figure 17:
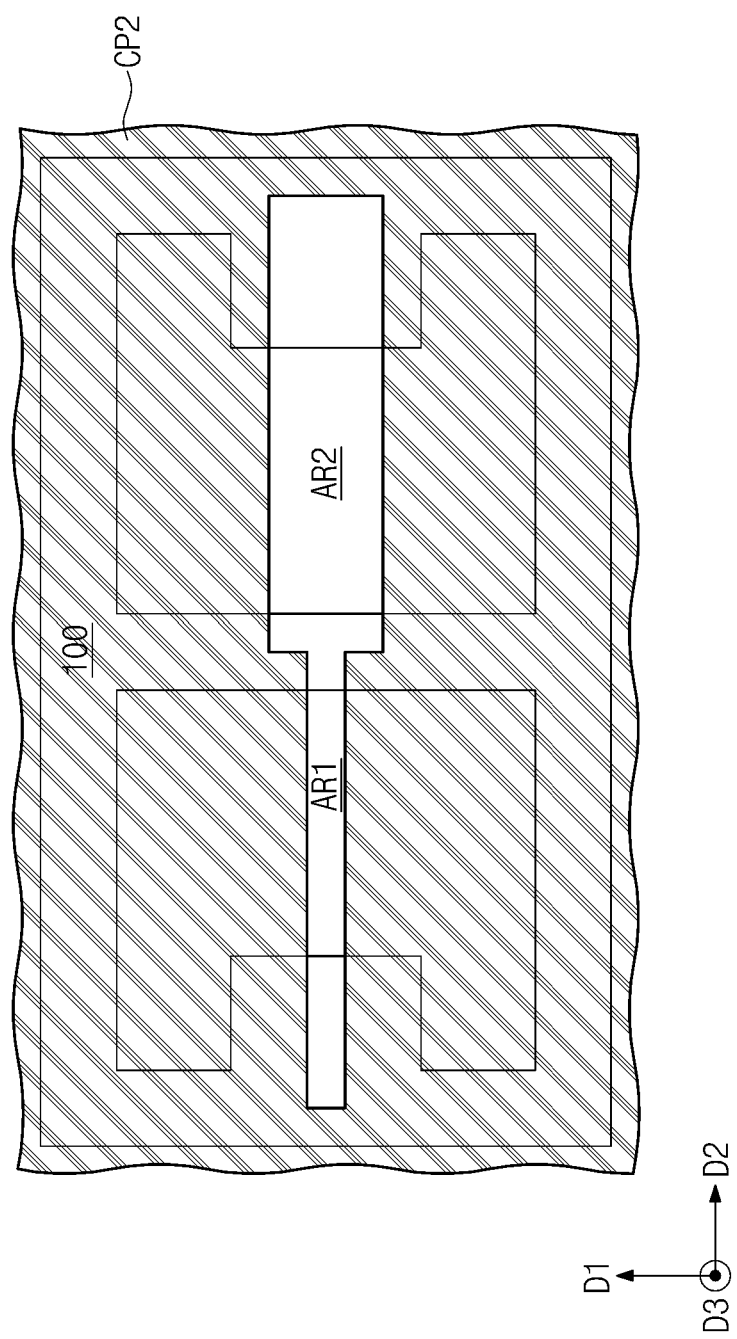

Referring to FIG. 17, a second cutting mask (CP2) may be formed. The second cutting mask (CP2) may be provided for use in cutting the first active region AR1 to form the first PMOS region PR1 and the first NMOS region NR1 and for use in cutting the second active region AR2 to form the second PMOS region PR2 and the second NMOS region NR2. Because a method of forming the second cutting mask (CP2) is similar to that described with reference to FIGS. 7A through 7D, a detailed description thereof is omitted.

After that, a third etching process using the second cutting mask (CP2) may be performed. Through the third etching process, trenches (not illustrated) may be formed that completely define the first PMOS region PR1, the first NMOS region NR1, the second PMOS region PR2, and the second NMOS region NR2. As a result, PMOS regions and NMOS regions having varying widths and which do not exhibit a corner rounding such as any of those illustrated in FIG. 12 may be formed.

According to the inventive concept described above, using a plurality of mask patterns and at least one cutting mask, a corner rounding that may occur when an active region having a varying width is formed on a substrate may be removed. Thus, an error such as a short, which might otherwise occur due to a reduced space between devices in a scaled down semiconductor device, may be prevented.

Although examples of inventive concept have been described, it should be understood that numerous modifications, changes, variations, and substitutions can be devised by those skilled in the art without departing from the true spirit and scope of the inventive concept as set forth in the appended claims.

What is claimed is:

1. A method of manufacturing a semiconductor device comprising:
    forming first trenches that define active patterns extending in a first direction on a substrate;
    forming a first insulating layer filling the first trenches;
    forming first mask patterns extending in the first direction and each of which has a first width along a second direction perpendicular to the first direction;
    forming a second mask pattern extending in the first direction while having a second width along the second direction;
    forming a second trench that forms a partly defined active region by executing a first etching process that etches the active patterns and the first insulating layer using the first mask patterns and the second mask pattern; and
    forming a second insulating layer filling the second trench.

2. The method of claim 1, wherein the second mask pattern is formed to overlap each of the first mask patterns as viewed in a plan view.

3. The method of claim 2, wherein the first etching process forms a rounded corner in the partly defined active region beneath a corner, among those of the first mask patterns and the second mask pattern, where the second mask pattern does not overlap either of the first mask patterns as viewed in the plan view, and
    further comprising:
    forming a cutting mask having a mask pattern corresponding to parts of a PMOS region and an NMOS region;
    forming a third trench that defines the PMOS region and the NMOS region along with the second trench by executing a second etching process that etches the partly defined active region and removes the rounded corner therefrom, using the cutting mask,
    the PMOS region and the NMOS region containing respective ones of the active patterns; and
    forming a third insulating layer filling the third trench.

4. The method of claim 3, further comprising:
    forming a gate electrode crossing the active patterns of the PMOS region and the NMOS region along the second direction; and
    forming source/drain patterns in upper portions of the active patterns at opposite sides of the gate electrode.

5. The method of claim 1, wherein the second width is greater than the first width.

6. The method of claim 1, wherein the first mask patterns are formed before or after the second mask pattern is formed.

7. The method of claim 1, wherein the second mask pattern is formed not to overlap either of the first mask patterns but to contact each of the first mask patterns.

8. The method of claim 7, wherein the first mask patterns and the second mask pattern are formed at the same level as one another relative to the substrate.

9. The method of claim 7, wherein the first etching process forms a rounded corner in the partly defined active region beneath a corner, among those of the first mask patterns and the second mask pattern, where the second mask pattern does not contact either of the first mask patterns as viewed in a plan view, and
    further comprising:
    forming a cutting mask having a mask pattern corresponding to part of the active region;
    forming a third trench that defines the active region along with the second trench by executing a second etching process that etches the partly defined active region and removes the rounded corner therefrom, using the cutting mask; and forming a third insulating layer filling the third trench.

10. A method of manufacturing a semiconductor device comprising:
   forming first trenches that define active patterns extending in a first direction on a substrate;
   forming a first insulating layer filling the first trenches;
   forming a first mask pattern extending in the first direction and which has a first width along a second direction perpendicular to the first direction;
   forming a second mask pattern extending in the first direction and which has a second width along the second direction;
   forming a second trench that forms a partly defined active region by executing a first etching process that etches the active patterns and the first insulating layer using the first mask pattern and the second mask pattern; and
   forming a second insulating layer filling the second trench.

11. The method of claim 10, wherein the second mask pattern is formed to overlap the first mask pattern as viewed in a plan view.

12. The method of claim 11, wherein the first etching process forms a rounded corner in the partly defined active region beneath a corner, among those of the first mask pattern and the second mask pattern, where the second mask pattern does not overlap the first mask pattern as viewed in the plan view, and
   further comprising
   forming a cutting mask having a mask pattern corresponding to part of the active region;
   forming a third trench that defines the active region along with the second trench by executing a second etching process that etches the partly defined active region and removes the rounded corner therefrom, using the cutting mask; and
   forming a third insulating layer filling the third trench.

13. The method of claim 10, wherein the second mask pattern is formed not to overlap the first mask pattern as viewed in a plan view but to lie adjacent to the first mask pattern.

14. The method of claim 13, wherein the first mask pattern and the second mask pattern are formed at the same level as one another relative to the substrate.

15. The method of claim 13, wherein the first etching process forms a rounded corner in the partly defined active region beneath a corner, among those of the first mask pattern and the second mask pattern, where the second mask pattern does not contact the first mask pattern as viewed in plan the plan view, and
   further comprising:
   forming a cutting mask having a mask pattern corresponding to part of the active region;
   forming a third trench that defines the active region along with the second trench by executing a second etching process that etches the partly defined active region and removes the rounded corner therefrom, using the cutting mask; and
   forming a third insulating layer filling the third trench.

16. A method of manufacturing a semiconductor device comprising:
   forming, in a semiconductor substrate, first trenches that delimit parallel linear active patterns spaced apart from one another in a first direction and each extending longitudinally in a second direction perpendicular to the first direction;
   forming a first insulating layer filling the first trenches;
   executing a first patterning process to form at least one first mask pattern and executing a second patterning process, discrete from the first patterning process, to form a second mask pattern before or after the at least one first mask pattern is formed,
   wherein each said at least one first mask pattern lies over at least part of a respective one of the active patterns and has a side extending in the second direction parallel to the active patterns, and the second mask pattern has a side extending in the first direction and which meets the side of each said at least one first mask pattern as viewed in plan, whereby the side of the second mask pattern subtends a right angle with the side of each said at least one first mask pattern as viewed in a plan view;
   executing a first etching process, using the first and second mask patterns as an etch mask, to remove sections of the active patterns and the first insulating layer and thereby form a second trench; and
   forming a second insulating layer filling the second trench.

17. The method of claim 16, wherein each said at least one first mask pattern has a shape of a rectilinear polygon as viewed in the plan view, and
   the first etch process forms a partially defined active region having a rounded corner beneath a corner of the first mask pattern, and
   further comprising forming a cutting mask having an opening therethrough over the rounded corner; and
   executing a second etch process using the cutting mask as an etch mask to remove the rounded corner.

18. The method of claim 17, wherein the second etch process forms a third trench that together with the second trench delimits at least one active region in the shape of a rectilinear polygon having more than four sides.

19. The method of claim 16, wherein the forming of the at least one first mask pattern comprises forming first mask patterns that are spaced apart from each other in the first direction and each have the shape of a rectilinear polygon as viewed in the plan view, and
   the first etch process forms a partially defined active region having a respective rounded corner beneath each of at least one of the corners of the first mask patterns, and
   further comprising forming a cutting mask having openings therethrough over each said respective rounded corner and at least one of the active patterns centrally among the active patterns in the first direction; and
   executing a second etch process using the cutting mask as an etch mask to remove each said respective rounded corner and at the same time divide the partially defined active region to thereby form a third trench which together with the second trench delimits two active regions each in the shape of a rectilinear polygon having more than four sides.

20. The method of claim 16, wherein the forming of the at least one first mask pattern comprises forming first mask patterns that are spaced apart from each other in the first direction and each have the shape of a rectilinear polygon as viewed in the plan view, and
   the first etch process forms a partially defined active region having a respective rounded corner beneath each of at least one of the corners of the first mask patterns, and further comprising forming a first cutting mask having an opening or openings therethrough over the at least one rounded corner; and executing a second etch process using the first cutting mask as an etch mask to remove each said rounded corner;

forming a second cutting mask having an opening therethrough over at least one of the active patterns centrally among the active patterns in the first direction; and executing a third etch process using the second cutting mask as an etch mask to divide the partially defined active region and thereby form a third trench which together with the second trench delimits two active regions each in the shape of a rectilinear polygon having more than four sides.

* * * * *